(12) United States Patent
Yanagisawa et al.

(10) Patent No.: US 6,480,425 B2
(45) Date of Patent: Nov. 12, 2002

(54) SEMICONDUCTOR DEVICE

(75) Inventors: Kazumasa Yanagisawa, Kokubunji (JP); Toshio Sasaki, Mizuho (JP); Satoru Nakanishi, Fuchu (JP); Yoshihiko Yasu, Koganei (JP)

(73) Assignees: Hitachi, Ltd., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

(21) Appl. No.: 09/820,972

(22) Filed: Mar. 30, 2001

(65) Prior Publication Data

US 2001/0028581 A1 Oct. 11, 2001

(30) Foreign Application Priority Data

Apr. 6, 2000 (JP) .................................... 2000-105345

(51) Int. Cl.[7] ................................................ G11C 7/00
(52) U.S. Cl. ................. 365/189.05; 365/205; 365/207; 365/196
(58) Field of Search ............................ 365/189.05, 205, 365/189.01, 207, 196

(56) References Cited

U.S. PATENT DOCUMENTS

| 4,991,139 | A | * | 2/1991 | Takahashi et al. | .......... 365/201 |
|---|---|---|---|---|---|
| 5,430,680 | A | * | 7/1995 | Parris | .......................... 365/222 |
| 6,201,728 | B1 | * | 3/2001 | Narui et al. | ................. 365/149 |
| 2001/0001598 | A1 | * | 5/2001 | Nanu et al. | .................. 365/149 |
| 2001/0028581 | A1 | * | 10/2001 | Yanagisawa et al. | .. 365/189.05 |
| 2001/0028592 | A1 | * | 10/2001 | Sekiguchi et al. | ...... 365/230.03 |
| 2001/0028593 | A1 | * | 10/2001 | Sekiguchi et al. | ...... 365/230.03 |

FOREIGN PATENT DOCUMENTS

| JP | 2-244756 | 9/1990 |
|---|---|---|
| JP | 3-147595 | 6/1991 |
| JP | 10-200073 | 7/1998 |
| JP | H10-200073 | 7/1998 |

* cited by examiner

*Primary Examiner*—Viet Q. Nguyen

(57) ABSTRACT

A dynamic RAM includes sense amplifiers each formed of a latch circuit consisting of MOSFETs of a first and second conductivity types with the application of a first and second voltages to the sources thereof, respectively, and having a pair of input/output nodes corresponding to a first bit line pair which is connected with a number of dynamic memory cells, and further includes pairs of switching MOSFETs of the first conductivity type which connect selectively an input/output node pair of the latch circuits to a pair of second bit lines provided commonly to a plurality of the first bit line pair in response to the reception of the select signal. The switching MOSFETs have their threshold voltage set smaller in terms of absolute value than the threshold voltage of the MOSFETs of the first conductivity type of the latch circuits, and the select signal has its level of turning off the switching MOSFETs set greater in terms of absolute value than the first voltage with respect to the second voltage.

2 Claims, 19 Drawing Sheets

FIG. 4

| | | |
|---|---|---|
| scl[4] | lwd[4] | scr[4] |
| sal[3] | ary[3] | sar[3] |
| scl[3] | lwd[3] | scr[3] |
| sal[2] | ary[2] | sar[2] |
| scl[2] | lwd[2] | scr[2] |
| sal[1] | ary[1] | sar[1] |
| scl[1] | lwd[1] | scr[1] |
| sal[0] | ary[0] | sar[0] |
| scl[0] | lwd[0] | scr[0] |

SEMICONDUCTOR DEVICE

BACKGROUND OF THE INVENTION

The present invention relates to a semiconductor device and a semiconductor integrated circuit device, and particularly to a high-speed writing technique useful for dynamic RAM (random access memory) which operates at a low voltage.

Japanese Patent Unexamined Publication No.Hei 10(1998)-200073 which pertains to dynamic RAM (DRAM) discloses various examples of the relation among the power voltage, data line voltage levels, main word line voltage levels, peripheral circuit voltage levels, and sub word line voltage levels.

Japanese Patent Unexamined Publication No.Hei 9(1997) 180436, which corresponds to U.S. Pat. No. 5,774,407, discloses a technique for the transition of the bit line select signal of DRAM between Vss and Vpp.

Japanese Patent Unexamined Publication No.Hei 2(1990)-244756 discloses a technique for the transition of the bit line signal between 2.2 V and 2.8 V and of the column select signal between 0 V and 5 V.

Japanese Patent Unexamined Publication No.Hei 3(1991)-147595 discloses a semiconductor memory which uses bipolar transistors as transistors connected between the bit lines and the sense amplifiers.

Semiconductor integrated circuit devices have their stated interface voltage retained typically at 3.3 V, whereas MOSFETs have lower withstand voltages in the course of progress of higher density integration, and there is a definite trend of the lower internal power voltage of LSI (large-scale integrated circuit) devices. An example of dynamic RAM having its internal power voltage lowered is described in Japanese Patent Unexamined Publication No.Hei 8(1996)-31171, which corresponds to U.S. Pat. No. 5,673,232.

SUMMARY OF THE INVENTION

In case the power voltage is relatively high around 3.3 V, the dynamic RAM has its operation speed determined from the read time of the sense amplifier, i.e., the time expended for amplifying a low signal voltage read out of a memory cell to a signal voltage which is as high as the power voltage. However, the study conducted by the inventors of the present invention has revealed that when the power voltage (vdd) is lowered to 1.8 V, the write operation becomes slower than the read operation, and if it is more lowered to 1.0 V that is about the lower limit of operation voltage of the CMOS circuit, the write operation can no more take place.

An object of the present invention is to provide a semiconductor integrated circuit device having a dynamic RAM which is capable of retaining the operational margin and achieving the speed-up at a low operation voltage.

Among the affairs of the present invention disclosed in this specification, representatives are summarized as follows. A semiconductor integrated circuit device includes sense amplifiers each formed of a latch circuit consisting of MOSFETs (or MISFETs) of a first and second conductivity types with the application of a first and second voltages to the sources thereof, respectively, and having a pair of input/output nodes corresponding to a first bit line pair (data line pair) connected with a plurality of dynamic memory cells, and further includes pairs of switching MOSFETs of the first conductivity type which connect selectively an input/output node pair of the latch circuits to a second bit line pair (signal transfer line pair) provided commonly to a plurality of the first bit line pair in response to the reception of the select signal, and the switching MOSFETs are designed to have their threshold voltage set smaller in terms of absolute value than the threshold voltage of the MOSFETs the first conductivity type of the latch circuits and the select signal is designed to have its level of turning off the switching MOSFETs set greater in terms of absolute value than the first voltage with respect to the second voltage.

These and other objects and novel features of the present invention will become apparent from the following description taken in conjunction with the accompanying drawings.

BRIEF DESCRIPTION OF THE DRAWINGS

FIG. 4 is a diagram showing an embodiment of the internal layout of the memory mat shown in FIG. 3;

DESCRIPTION OF THE PREFERRED EMBODIMENTS

Figure 1:
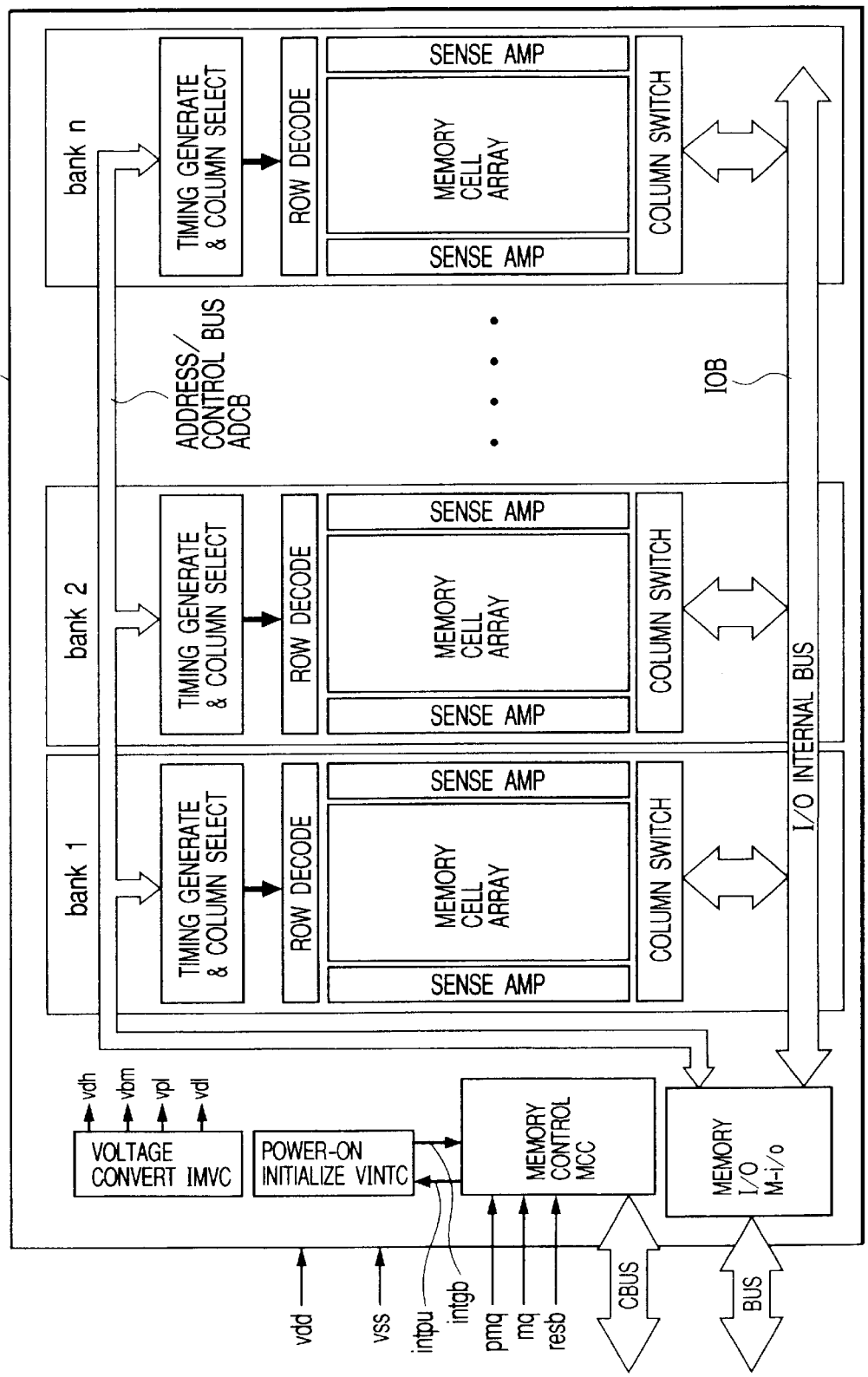
FIG. 1 is a block diagram showing an embodiment of the DRAM included in the semiconductor integrated circuit device based on this invention.

FIG. 1 shows by block diagram an embodiment of the dynamic RAM which is included in the semiconductor integrated circuit device based on this invention. This semiconductor device is intended for ASIC (application specified integrated circuit). The semiconductor device is made up of a number of circuit blocks in the form of modules or macro cells each performing a unit function independently so as to facilitate the design of ASIC. Each circuit block has a variable type and scale of the unit function.

The semiconductor device has a CMOS structure which enables the low-voltage operation, so that it has satisfactory operational characteristics under a power voltage (vdd) as low as 1.0 V, although this affair is not compulsory.

The term "MOS" stands for metal oxide semiconductor, however, it is recently used more widely inclusive of semiconductor devices in which substantial metallic portions are replaced with non-metallic electrical conductor such as poly-silicon, or oxide is replaced with other insulator. The term "CMOS" is also becoming technically comprehensive in accordance with MOS. The term "MOSFET" is now also used widely even to signify insulated gate field effect transistors. These terms "CMOS", "MOSFET", etc. used in the description of the present invention are compatible with their contemporary usage.

The dynamic RAM (will be termed "DRAM" hereinafter) has its memory cells, i.e., dynamic memory cells, each formed typically of a small number of elements including a capacitor for storing data in the form of charges and a MOSFET for cell selection, and thus can be made smaller. Therefore, even a large-capacity dynamic memory can be relatively small in size enough to constitute a module or function unit of a semiconductor integrated circuit device.

The DRAM shown in FIG. 1 has a bank structure so as to be adaptive to the increase of storage capacity, although this affair is not compulsory. The number of memory banks is variable within 16. One memory bank, e.g., memory bank #1, includes a memory cell array, sense amplifiers, bit line precharge circuits (not shown) which are integrated with the sense amplifiers, a timing generation & column selector, a row decoder, and a column switch circuit.

These memory banks have the connection of an address/control bus ADCB for the address and control signals and an memory internal bus (I/O internal bus) IOB for data input and output. The ADCB and IOB buses are connected to a memory input/output circuit M-I/O. The memory input/output circuit M-I/O includes a port which is coupled to the device internal bus BUS.

This figure is intended to show mainly the function of circuit blocks, and although the column switch circuit is situated orthogonally to the alignments of sense amplifiers, the circuit is actually laid to be correspondent to individual input/output nodes of sense amplifiers as will be explained later. Accordingly, the I/O internal bus IOB is actually formed to run over the memory cell array in parallel to the bit lines.

The DRAM further includes a voltage convert circuit IMVC as internal power supply circuit, a memory control circuit MMC for receiving the internal operation control signals (mq, pmq), reset signal (resb), and various operation control signals, which are fed in and out over the control bus CBUS, and a power-on initialize circuit VINTC. The voltage convert circuit IMVC includes charge pump circuits such as a voltage step-up circuit and negative voltage generation circuit.

Depending on the convenience of the management of design data of the design automation system used for the design of semiconductor devices, a circuit section which consists of a variety of elements can be assumed to be made up of a smaller number of elements. For example, the memory cell array, sense amplifiers, row decoder and column switch of one memory bank can be assumed to make up a memory mat, and the timing generation & column selector can be assumed to be a bank control circuit. In this case, each memory bank is assumed to be made up simply of a memory mat and a bank control circuit.

This DRAM has its memory mats, associated selection circuits, etc. designed to be virtually identical to known DRAMs which are stand-alone CMOS semiconductor devices. Namely, the DRAM of this embodiment can be applied intact to DRAMs which are stand-alone CMOS semiconductor devices. On this account, the detailed explanation of the internal arrangement is omitted, but will merely be briefed in the following.

The memory cell array includes a number of dynamic memory cells in a matrix arrangement, a number of word lines connected to the selection terminals of the memory cells, and a number of bit lines connected to the data input/output terminals of the memory cells. Each memory cell has its selecting MOSFET formed to have an n-type source region and n-type drain region in a p-type well region which is formed on a p-type monocrystalline silicon substrate, as will be explained later with FIG. 14.

The memory cell is insulated electrically from the p-type semiconductor substrate by an n-type separation semiconductor region having a relatively low impurity concentration, although this affair is not compulsory. The separation region can be assumed to be a deep well region, and it has the application of a positive voltage such as a step-up voltage (vdh) explained later. In consequence, the n-type separation region protects the p-type well region against unwanted carriers created by * particles in the p-type semiconductor substrate.

The p-type well region where the memory cells are formed has the application of a negative substrate bias voltage (vdl) which is produced by the voltage convert circuit IMVC which is the internal power supply circuit within the DRAM. In consequence, the selecting MOSFETs of the memory cells have a reduced tailing current or leak current, and the leakage of data charges from the storage capacitors of memory cells is alleviated.

Formed on the p-type well region by being interposed by an insulating film of silicon oxide film or the like are data storage capacitors. Each capacitor has its one electrode connected electrically to the electrode region which is assumed to be the source region of the selecting MOSFET. The capacitors of memory cells have their other electrodes unified to be a common electrode which is called a plate electrode. The plate electrode has the application of a prescribed voltage (vpl).

The data storage capacitor is desirably small so that the memory cell array is made small, while it has desirably a large capacitance in order to have a long data holding time by itself. On this account, the data storage capacitor has its dielectric film between the electrodes selected among materials of relatively large dielectric constants, e.g., tantalum oxide or silicon oxide, so as to have a large capacitance, and made extremely thin so as to have a large capacitance per unit area. The plate electrode voltage vpl of the data storage capacitors produced by the voltage convert circuit IMVC is set to be about a half level of the power voltage vdd.

In consequence, in both cases of one electrode of data storage capacitor having such a high-level voltage as the power voltage vdd and having such a low-level voltage as the ground voltage depending on data to be stored, the plate electrode voltage vpl is kept at about a half level of the power voltage vdd. Namely, the voltage applied to the dielectric film is limited to be as low as half the power voltage vdd. The lower application voltage allows the dielectric film to have a lower withstand voltage and a reduced undesirable leak current, enabling the reduction of film thickness to the extreme.

The timing generation & column selector has its operation controlled by the operation control signal provided by the global control circuit within the memory control circuit MMC, and activated or selected by the bank select signal on the ADCB bus thereby to produce various internal timing signals for controlling the operation of the bit line precharge circuit, row decoder, sense amplifiers and its own internal circuits such as the column selector. The column selector of the timing generation & column selector has its operation controlled by the internal timing signals, and decodes the column address signal on the ADCB bus thereby to produce a decode signal for the operation of the column switch circuit of the bank.

The row decoder has its operational timing controlled by the timing signal provided by the timing generation & column selector, and decodes the address signal on the ADCB bus thereby to select a word line of the memory cell array.

The bit line precharge circuit operates at the time before the row decoder is activated based on the precharge timing signal to precharge the bit lines of the memory cell array to the voltage level which is about a half level of the power voltage vdd.

The sense amplifiers operate based on the sense amplifier timing signal which is produced by the timing generation & column selector after the row decoder has been activated, and amplify the signal voltages which are read out of memory cells selected by the row decoder onto the bit lines. The sense amplifier which is provided for each bit line pair is identical to the known CMOS sense amplifier.

Specifically, the sense amplifier has a pair of p-channel MOSFETs having their gates and drains connected crisscross to each other and a pair of n-channel MOSFETs having their gates and drains connected crisscross to each other. The p-channel MOSFETs and n-channel MOSFETs have their drains connected to the bit line pair. The p-channel MOSFETs have their sources connected together and supplied with the operation voltage via a switching MOSFET which operates based on the sense amplifier timing signal. Similarly, the n-channel MOSFETs have their sources connected together and supplied with the operation voltage, i.e., ground voltage, via a switching MOSFET which operates based on the sense amplifier timing signal.

The operation voltages are, for example, the power voltage vdd which corresponds to the high level of bit lines and a step-up voltage vdh produced from vdd, as will be explained later with FIG. 12 and other figures. The sense amplifier is based on the overdrive scheme in which it operates by being supplied with the step-up voltage vdh during the period from the beginning of amplification until the voltage of "high" bit line reaches the prescribed voltage level. Similarly, the ground voltage vss and a negative voltage vdl are used, and the sense amplifier may be based on the overdrive scheme in which it operates by being supplied with the negative voltage vdl during the period from the beginning of amplification until the voltage of "low" bit line reaches the prescribed voltage level. The sense amplifier has its operation voltages switched to the inherent power voltages vdd and vss when the bit line voltages approach the steady-state levels derived from vdd and vss.

The layout of sense amplifiers in two areas on both sides of the memory cell array is due to the following intention as will be explained with FIG. 5 and FIG. 6. The sense amplifiers on one side of the memory cell array are connected with every second bit line out of the bit lines of the memory cell array, while the sense amplifiers on the other side of the memory cell array are connected with remaining every second bit line out of the bit lines of the memory cell array. This arrangement is effective for minimizing the pitch of bit lines in case the MOSFETs of each sense amplifier take up a larger width relative to the line pitch.

The column switch circuit operates based on the select signals provided by the column selector. The column switch circuit selects bit lines (first bit lines) designated by the column selector out of the bit lines of the memory cell array, and connects the selected bit lines to the memory internal bus IOB (global bit lines or second bit lines).

The memory input/output circuit M-IO, which is connected with the internal bus BUS of the semiconductor device, receives the address signal and control signal on the bus, and transfers the signals to the internal bus ADCB. The memory input/output circuit M-IO transacts data of the memory between the bus BUS and the memory internal bus IOB.

The memory control circuit MCC operates based on the internal first and second operation control signals mq and pmq and the reset signal resb of the semiconductor device. The memory control circuit MCC includes a first control logic circuit which produces an internal operation control signal bbcz from the first and second operation control signals mq and pmq, and a second control logic circuit which produces a crude initialization control signal from the first operation control signal mq and reset signal resb, although this affair is not compulsory.

The voltage convert circuit IMVC produces internal voltages including the memory cell substrate bias voltage vdl, plate voltage vpl, word line select voltage and step-up voltage vdh for the overdriving of the sense amplifiers from the power voltages supplied between the power voltage terminals vdd and vss of the DRAM. The substrate bias voltage vdl and step-up voltage vdh are produced in the circuit module IMVC of the DRAM.

The power-on initialize circuit VINTC initializes the DRAM by being controlled by the memory control circuit MCC.

Figure 2:
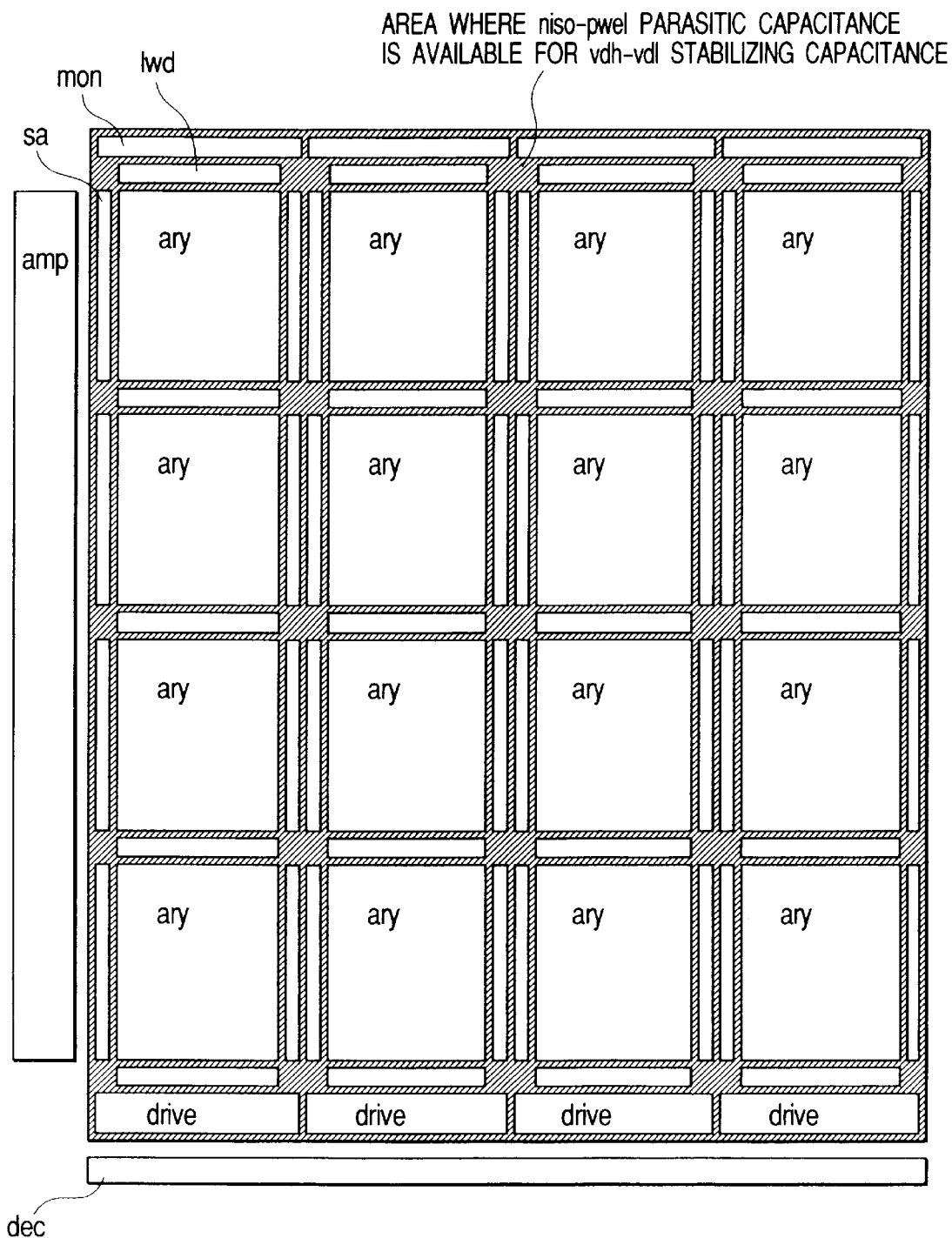
FIG. 2 is a diagram showing in brief an embodiment of the layout of the memory cell array section of the DRAM.

FIG. 2 shows schematically the layout of the memory cell arrays of the DRAM based on an embodiment of this invention. Shown by this example are four memory banks aligning in the horizontal direction on the drawing. Each memory bank has its memory cell array divided into four arrays (ary) along the word lines in the vertical direction on the drawing. The four arrays aligning vertically are accompanied at the top and bottom by word line drivers lwd. The memory cell array of each bank is adjoined on both sides by sense amplifiers sa as mentioned previously, and accordingly each array ary has associated sense amplifiers sa on its right and left sides and local word drivers lwd on its upper and lower sides.

Main word lines are laid to run over the four arrays ary. The main word lines undergo the selection by drive circuit (drive) located below the memory bank. The drive circuit produces main word line select signals from the select signals provided by the decoder (dec). The decoder also produces local word line select signals. A monitor circuit (mon) is placed above the memory bank, which verifies the select/non-select levels of the main word lines.

A number of local word lines of the array ary have the assignment of a main word line. The local word line driver lwd receives the signal on the main word line and the select signal for selecting one of the local word lines of the main word line, and selects one local word line of the array ary. The local word lines are connected to the address select terminals of the memory cells.

Over the array ary, bit line pairs are laid to run in the lateral direction, and global bit lines (second bit lines) which become the above-mentioned memory internal bus IOB are laid in parallel to the bit line pairs. The sense amplifier sa includes switching MOSFETs for column selection, which connect one of bit line pairs assigned to the global bit line pair to the sense amplifier in response to the column select signal. Shown by amp are write/read amplifiers provided in correspondence to the global bit line pairs.

The n-channel MOSFETs which form the memory arrays (ary), sense amplifiers (sa), local word driver (lwd), drive circuit (drive), and monitor circuit (mon) share the p-type well. The pn junction between the p-type well and an n-type separation region which is formed as deep as the p-type well works for stabilizing the vdh-vbl voltage.

Figure 3:
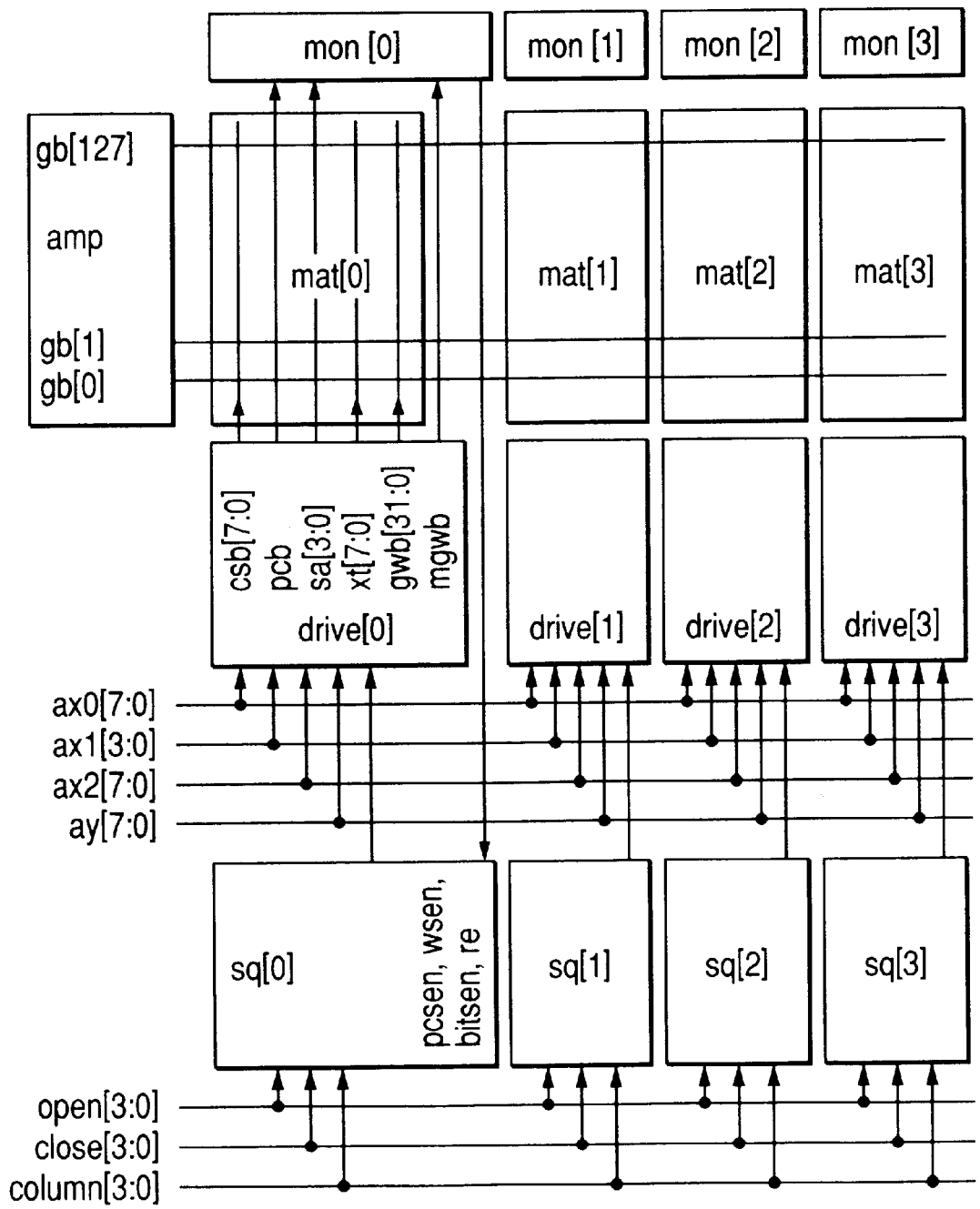
FIG. 3 is a block diagram showing an embodiment of the core section of the inventive DRAM.

FIG. 3 shows by block diagram the core section of the DRAM. In the figure, memory mats mat(0) through mat(3), each having a storage capacity of 256K bits, provide a total storage capacity of 1 M bits. The memory mats mat(0)-mat(3) include the memory cells, local word drivers lwd, sense amplifiers sa, and associated control circuit.

Drive circuits drive(0)-drive(3) each include an address decoder and level convert circuit. Circuits mon(0)-mon(3) and sq(0)-sq(3) which control the operational sequence of the DRAM are disposed above and below the respective memory mats. Shown by amp are read/write amplifiers. There are 256 word lines and 1024 bit line pairs for the 256K-bit memory mat. Global bit lines gb are laid to run through the memory mats mat(0)-mat(3), with one global bit line gb being assigned to eight bit line pairs. There are 128 pairs of global bit lines gb(0)-gb(127) for the 1024 bit line pairs.

FIG. 4 shows an embodiment of the internal layout of the memory mat (mat). It includes the local word drivers lwd, sense amplifiers sal/sar laid on the left and right sides of the memory cell arrays ary, and control circuits scl/scr for the local word drivers lwd and sense amplifiers sal/sar located at crisscross areas of the sense amplifiers and local word drivers.

In this embodiment, the memory array ary is divided into four ary(0)-ary(3) along the word lines. The 1024 bit line pairs are divided into four groups so that each memory array ary has 256 bit line pairs. Accordingly, one memory array ary has a storage capacity of 256-by-256 (64K) bits.

Figure 5:
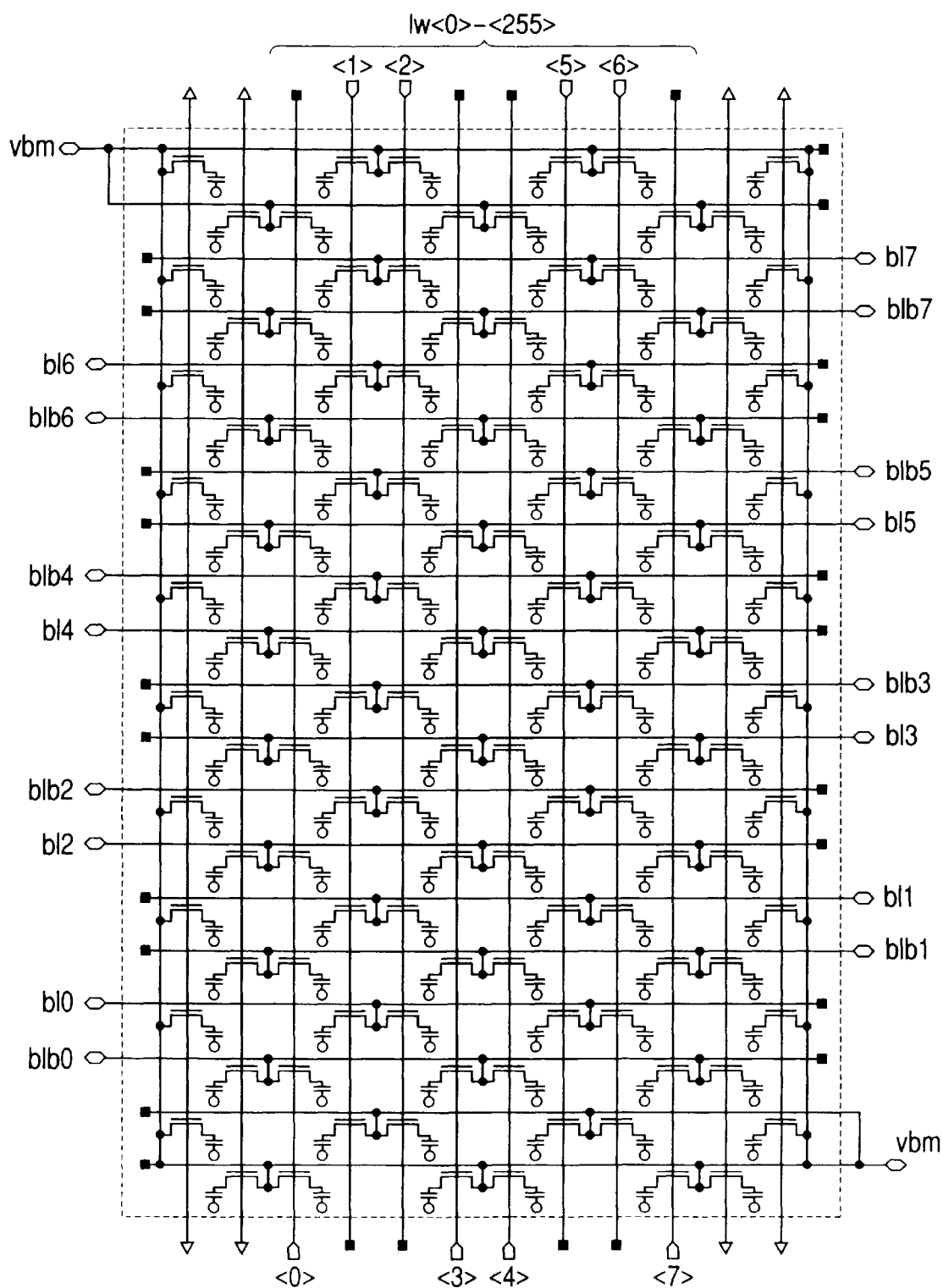
FIG. 5 and FIG. 6 are circuit diagrams showing an embodiment of the memory cell array shown in FIG. 4.
Figure 6:
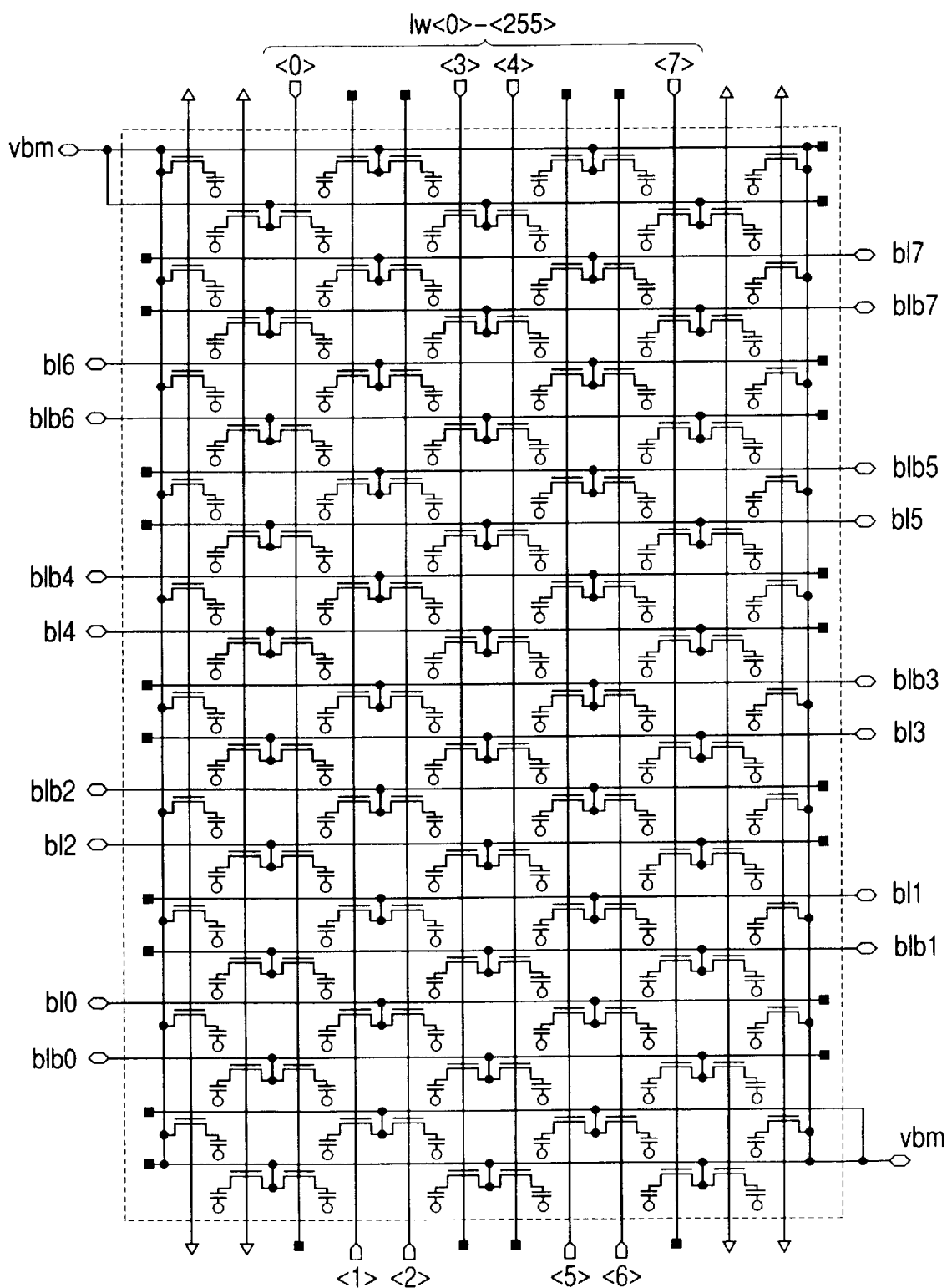

FIG. 5 and FIG. 6 show an embodiment of the memory array ary. FIG. 5 shows the even-numbered memory arrays ary(0) and ary(2) out of the divided memory arrays ary(0)-ary(3), while FIG. 6 shows the odd-numbered memory arrays ary(1) and ary(3). The difference of FIG. 5 and FIG. 6 results from the location of local word drivers lwd. The local word drivers, except for the lwd(0) and lwd(4) located at the ends, select the local word lines lw laid above and below them.

The local word drivers located below the memory array ary in FIG. 5 select the local word lines numbered 0,3,4, and so on out of the 256 lines, and these drivers are located above the memory array ary in FIG. 6. The local word drivers located above the memory array ary in FIG. 5 select the local word lines numbered 1,2,5, 6 and so on out of the 256 lines, and these drivers are located below the memory array ary in FIG. 6.

In FIG. 5 and FIG. 6, 128 memory cells each consisting of a selecting MOSFET and a storage capacitor are connected to bit lines bl and blb, and a total of 256 memory cells are connected to one bit line pair (bl/blb). Each memory array ary has 256 pairs of bit lines bl and blb. In this embodiment, the memory array ary includes dummy memory cells (and dummy word lines) on the left and right ends of the bit lines bl by reason for the fabrication accuracy, and also includes dummy bit lines bl at the and bottom of the memory array ary by the same reason. Voltage vbm is for the precharging of bit lines bl, and it is used for the processing of depletion layer.

Figure 7:
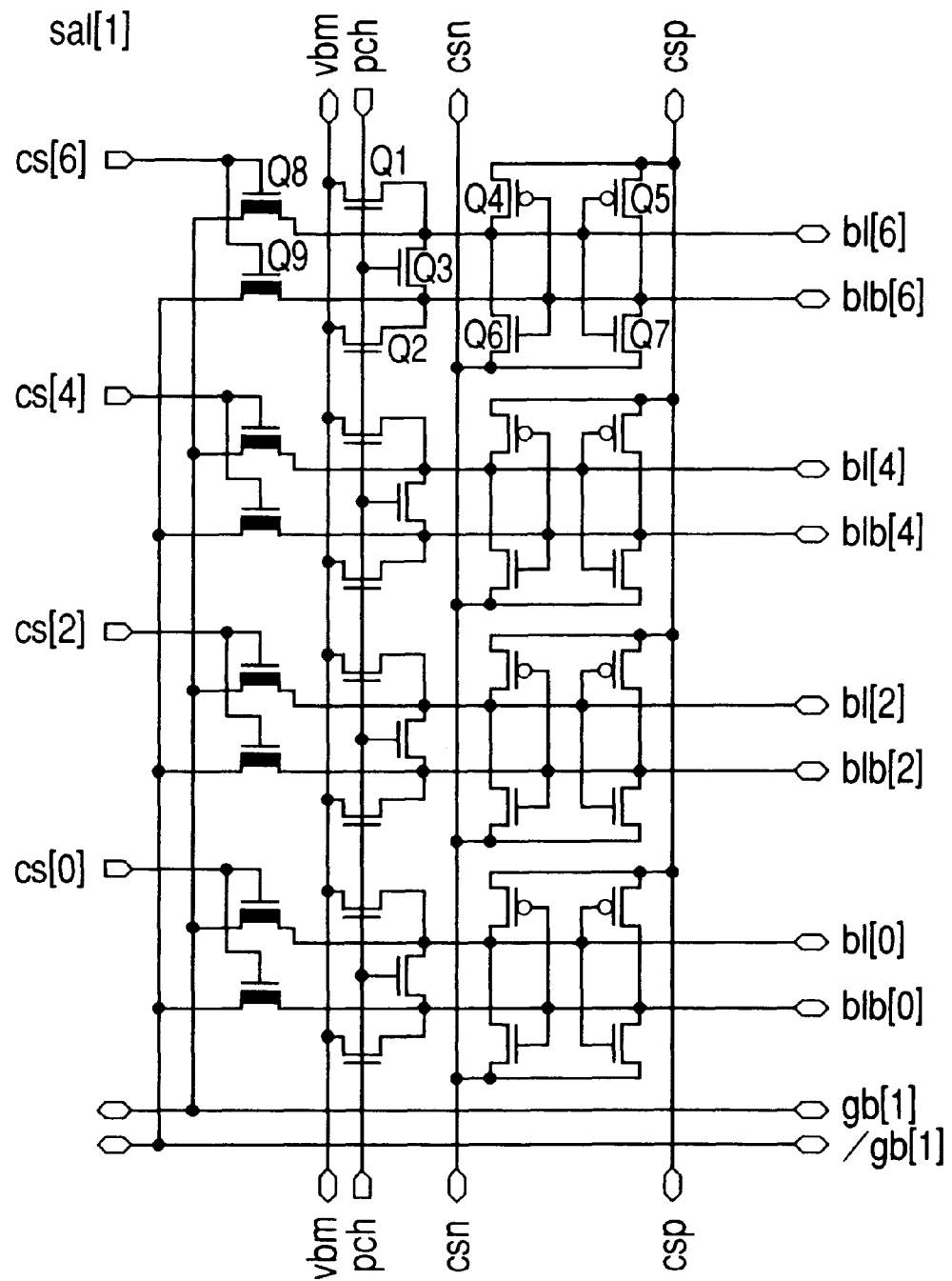
FIG. 7 and FIG. 8 are circuit diagrams showing an embodiment of the sense amplifier section shown in FIG. 4.
Figure 8:
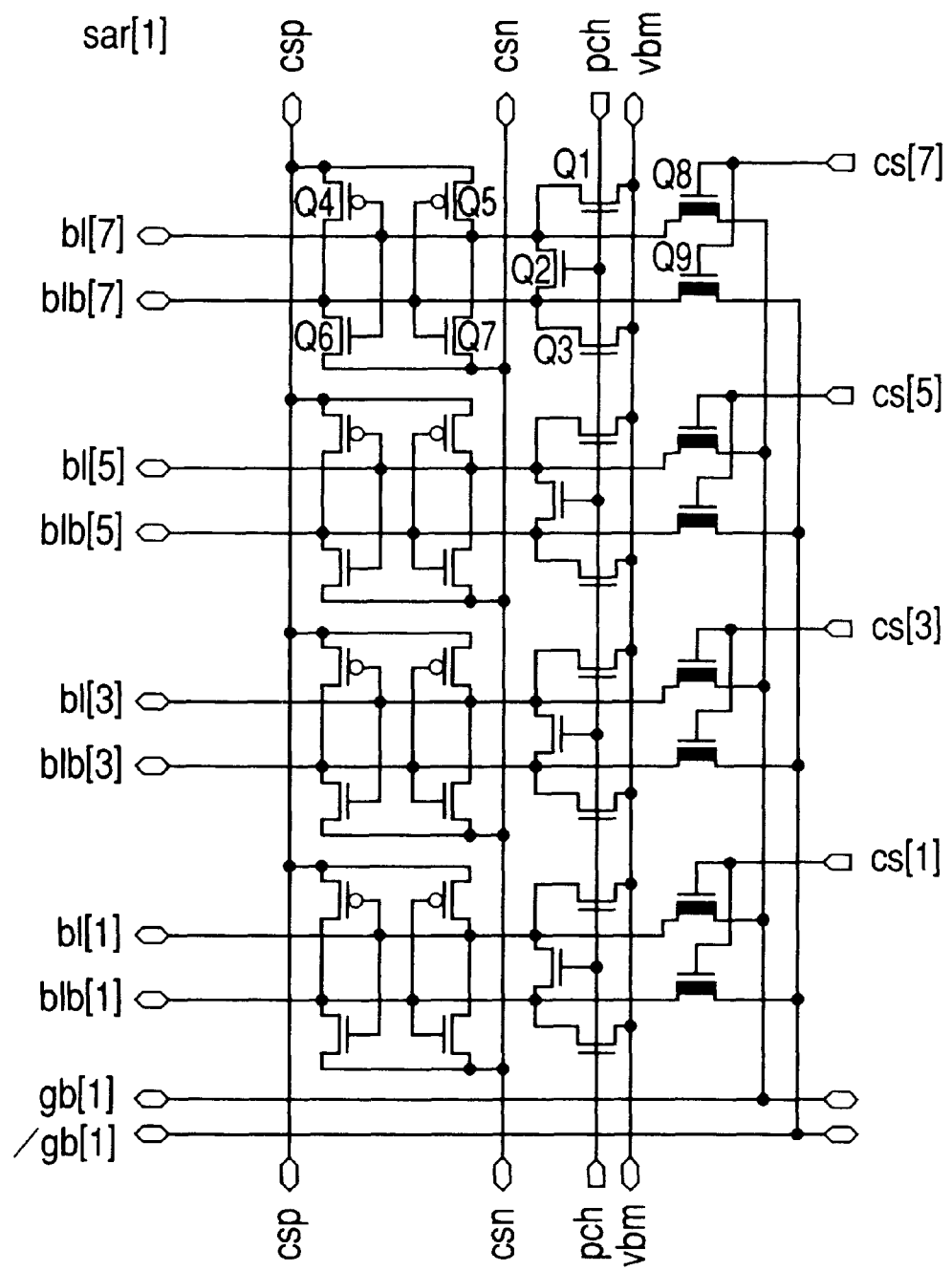

FIG. 7 and FIG. 8 are circuit diagrams of an embodiment of the sense amplifiers located on both sides of the memory arrays ary as shown in FIG. 4. FIG. 7 shows sense amplifier sal(1) on the left side, and FIG. 6 shows sense amplifier sar (1) on the right side. These two circuits differ in the column switch circuit which connects the bit lines bl to the global bit lines gb. Specifically, among the eight bit line pairs bl(0) and /bl(0) through bl(7) and /bl(7) assigned to one global bit line pair gb(i) and /gb(i), the column switches provided for the sense amplifiers of FIG. 7 connect even-numbered bit line pairs bl(0) and /bl(0) through bl(6) and /bl(6) to the global bit line pair gb(i) and /gb(i), while the column switches provided for the sense amplifiers of FIG. 8 connect odd-numbered bit line pairs bl(1) and /bl(1) through bl(7) and /bl(7) to the global bit line pair gb(i) and /gb(i).

The circuits of FIG. 7 and FIG. 8 are basically the same, and therefore common symbols are used for circuit elements of both figures. Specifically, in FIG. 7, each sense amplifier has a pair of p-channel MOSFETs Q4 and Q5 having their gates and drains connected crisscross, and a pair of n-channel MOSFETs Q6 and Q7 having their gates and drains connected crisscross. The p-channel MOSFETs and n-channel MOSFETs have their drains connected to the corresponding bit line pair bl(6) and /bl(6). The p-channel MOSFETs Q4 and Q5 have their sources connected to a common source line csp and are supplied with the operation voltage by way of a switching MOSFET (not shown) which is controlled by the sense amplifier timing signal. Similarly, the n-channel MOSFETs Q6 and Q7 have their sources connected to a common source line csn and are supplied with the operation voltage, i.e., ground voltage, by way of a switching MOSFET (not shown) which is controlled by the sense amplifier timing signal.

In the standby state, the bit line pairs bl and /bl are given a precharge voltage vbm which is the mid level of the power voltage vdd and ground voltage vss by MOSFETs Q1, Q2 and Q3 which become conductive in response to the activation of the precharge signal pch. Eight sense amplifiers make the smallest group, and two sets of four amplifiers are laid on both sides of the memory array ary with the assignment of a global bit line pair gb(i) and /gb(i). MOSFETs Q8 and Q9 which selectively connect the eight bit line pairs bl(0) and /bl(0) through bl(7) and /bl(7) to the global bit line pair gb(i) and /gb(i) are designed to have a lower vt (threshold voltage) as compared with that of the n-channel MOSFETs of sense amplifier.

Figure 9:
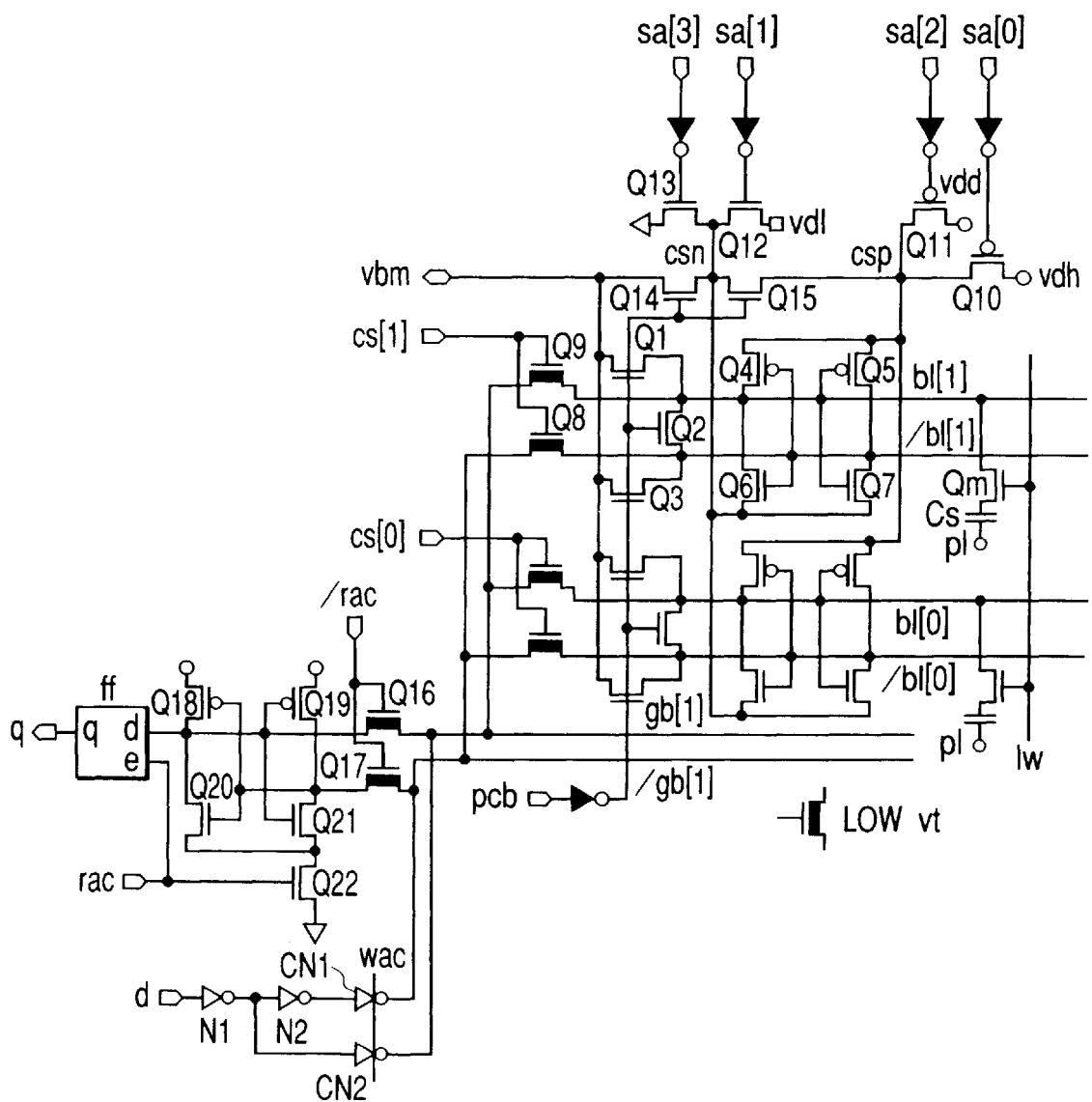
FIG. 9 is a circuit diagram used to explain the data signal propagation paths from memory cells to the input/output circuit of the inventive DRAM.

FIG. 9 is a circuit diagram for explaining the data signal propagation paths from memory cells to the data input/output circuit in the dynamic RAM. A portion of memory array shown in this figure includes two bit line pairs bl(0) and /bl(0) and bl(1) and /bl(1) and two memory cells located at the intersections of the bit lines bl(0) and bl(1) and a local word line wl. The bit line pair bl(1) and /bl(1) is accompanied by a sense amplifier which is formed as a CMOS latch circuit of MOSFETs Q4 through Q7, and a precharge circuit of MOSFETs Q1 through Q3.

The p-channel MOSFETs Q4 and Q5 and n-channel MOSFETs Q6 and Q7 of the sense amplifier have their common source lines csp and csn supplied with the precharge voltage vbm, which is also supplied to the bit line pair bl(1) and /bl(1), via MOSFETs Q14 and Q15 which become conductive in response to the activation of the precharge signal pcb.

In the early phase of activation of the sense amplifier, the common source line csp is pulled to the step-up voltage vdh, which is higher than the power voltage vdd, by the on-state MOSFET Q10, and after the bit line bl(1) or /bl(1) is pulled nearly to vdd, the MOSFET 10 is turned off and another MOSFET 11 is turned on, causing the source line csp to have the power voltage vdd. Another common source line csn is pulled to the negative voltage vdl below the ground voltage vss by the on-state MOSFET Q12, and after the bit line /bl(1) or bl(1) is pulled nearly to vss, the MOSFET 12 is turned off and another MOSFET 13 is turned on, causing the source line csn to have the ground voltage vss. The above-mentioned sense amplifier control is based on signals sa (0)-sa (3) which are produced by a control circuit (se) as will be explained later.

The MOSFETs Q8 and Q9 for column selection are n-channel MOSFETs having such a low vt (threshold voltage) as of depletion mode for connecting the bit line bl to the global bit line (common bit line or input/output line) gbl, which affair is one of the essentials of the present invention, and have a gate control signal with a high level of the power voltage vdd and a low level of the negative voltage vdl for the suppression of leak current.

The global bit line pair gb(i) and /gb(i) is accompanied by a write amplifier. The write amplifier receives a data signal d to be written, inverts the signal with an inverter N1, further inverts the signal with another inverter N2 to produce a signal which is in-phase with the input signal d, and times these signals with clocked inverter circuits CN1 and CN2 to produce signals to be placed for writing on the global bit line pair gb(i) and /gb(i).

The global bit line pair gb(i) and /gb(i) is further connected via MOSFETs Q16 and Q17, which have the same low threshold voltage as the column selecting MOSFETs and receive the read control signal /rac, to the input terminals of the main amplifier which is made up of a CMOS latch circuit of p-channel MOSFETs Q18 and Q19 and n-channel MOSFETs Q20 and Q21 and a switching MOSFET Q22 which supplies the ground voltage to the common sources of the n-channel MOSFETs Q20 and Q21. The switching MOSFET Q22 has its gate given a control signal rac. The output signal of the main amplifier is held by a latch circuit (ff) which is enabled by the control signal rac, and released as readout signal q.

Figure 10:
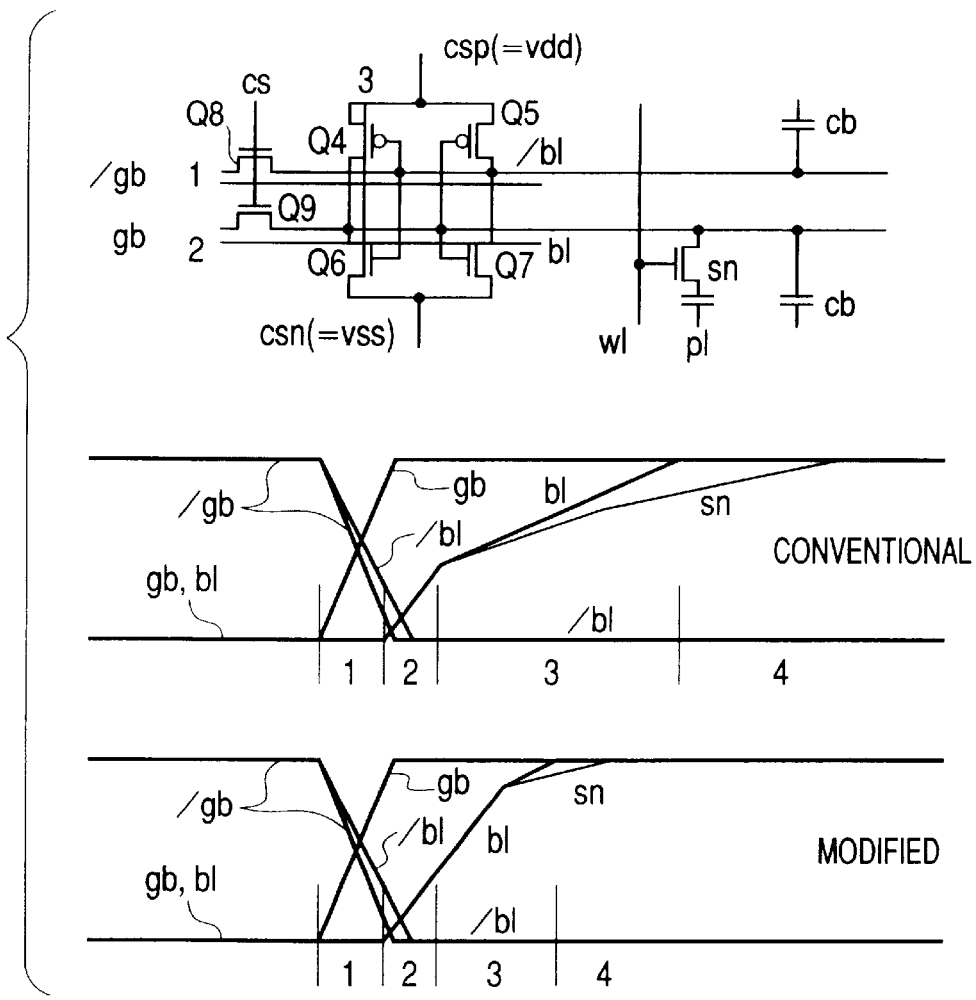
FIG. 10 is a diagram used to explain the write operation of the inventive DRAM.

FIG. 10 is a diagram for explaining the write operation of the DRAM. The dynamic memory cell stores binary data in terms of the presence or absence of charges in the storage capacitor. When the word line is selected and the address selecting MOSFET is brought to the on state, the storage capacitor is charged to the precharge voltage on the bit line. Therefore, once the word line is selected, it is necessary to rewrite (refresh) the data in the memory cell by activating the sense amplifier on the crisscross bit line to amplify the voltage of the bit line in connection to the memory cell thereby to regain the high level or low level in correspondence to the stored charges.

In the read operation, a high level or low level voltage on the bit line which has been refreshed is led through the column switch to the main amplifier. Whereas in the write operation, it is necessary to reverse the state of the CMOS latch circuit following the amplification of sense amplifier in accordance with the write signals on the global bit line pair gb and /gb based on the writing of data which is opposite to the stored state of the memory cell. When /bl is high and bl is low, for example, the reversing write operation for making the global bit line pair gb and /gb to become low and high, respectively, takes place in the following four steps (1) through (4).

(1) Pull-down of bit line /bl

In the early phase of writing, the bit line bl voltage is lowered by the current which is put onto the global bit line /gbl. At this time, the p-channel MOSFET Q5 of the sense amplifier is conductive, and the MOSFET Q8 of column switch which is superior in drive power draws the current. This operation is determined from the conductance ratio between the column selecting MOSFET Q8 and the p-channel MOSFET Q5 of the sense amplifier (Q8 is larger in conductance by about two fold than Q5), and it provides the write margin.

Although the above-mentioned ratio is desirably larger from the viewpoint of write operation margin, the read margin must also be ensured, i.e., the latched state of the sense amplifier (rewritten state of memory cell) must be prevented from being inverted by the precharge voltage of the global bit line gb resulting from its connection, and therefore it is necessary for the column selecting MOSFET Q8 and n-channel MOSFET Q7 of the sense amplifier to have a certain conductance ratio (Q7 has a larger conductance which is 1.5–2.0 times that of Q8). The current brought in from the high-level global bit line gb flows intact to the common source line csn (at vss) via the on-state n-channel MOSFET Q6 of the CMOS latch circuit, and therefore it does not contribute to the rise of the bit line bl voltage.

(2) Pull-up of bit line bl

After the bit line /bl voltage has been lowered sufficiently, the sense amplifier has its n-channel MOSFET Q6 switched from on-state to off-state, and the bit line bl voltage is raised by the current brought in from the global bit line gb. This operation raises the bit line bl voltage to the level which is short of the threshold voltage vt of the MOSFET Q9 from the select level of the column select signal cs.

(3) Another pull-up of bit line bl

Subsequently, the bit line bl is pulled up only by the p-channel MOSFET Q4 of the sense amplifier. Specifically, the low-level bit line /bl causes the p-channel MOSFET Q4 to become conductive, pulling up the bit line bl to the high level which is derived from the operation voltage vdd on the common source line csp.

(4) Pull-up of memory cell storage node sn

The on-state of the address selecting MOSFET allows the storage node (sn) of memory cell to vary in its voltage level to follow the above-mentioned voltage variation of the bit line bl, and it ultimately settles at the high-level of bit line bl derived from the power voltage vdd.

With MOSFETs having a threshold voltage vt of around 0.4 V, when the power voltage vdd is set to be as low as around 1 V, the bit line bl voltage does not possibly reach the threshold voltage (0.4 V) of the MOSFET Q7 in the pull-up operation (2). Specifically, even though the threshold voltage of Q9 is around 0.4 V, the pulled-up bit line bl voltage raises the source voltage, resulting in a threshold voltage in effect higher than 0.4 V due to the substrate effect. The CMOS inverter circuit of MOSFETs Q7 and Q5 has its logic threshold estimated to be lower than a half level of power voltage vdd (i.e., 0.5 V) since the MOSFET Q7 has a larger conductance than Q5 by about four fold, but it is still higher than the threshold voltage vt (0.4 V) of Q7.

For the output transition of the CMOS inverter circuit of Q7 and Q5 by the high level (vdd) of the global bit line gb, it is necessary to become higher than the logic threshold, and the failure of invert-writing is highly possible due to the loss of voltage level by the presence of MOSFET Q9. The normal write operation is even more uncertain due to the disparity of element characteristics and fluctuation of power voltage vdd.

Even if the write operation is certain, pulling-up of the bit line bl by the p-channel MOSFET Q5 takes an excessive time in the operation (3), resulting in a longer write time of memory cell as compared with the read time by the sense amplifier sa. The memory cycle restricted by the long write time slows down the DRAM operation.

For the enhancement of write speed, an effective scheme is simply raising the overall drive power, i.e., use of elements of larger size. However, this scheme has a side-effect of larger element areas, which ruins the significance of using dynamic memory cells. For coping with this matter, this embodiment is designed to reduce the time expended by the operation (3) based on the in-effect fall of the threshold voltage vt of the column selecting MOSFETs Q8 and Q9.

Accordingly, in this embodiment, the column selecting MOSFETs Q8 and Q9 have their threshold voltage vt set lower than that of MOSFETs of other circuits including the sense amplifier. This threshold voltage is specifically 0.2 V for the foregoing example, although it varies depending on the power voltage vdd, or alternatively depletion-mode MOSFETs are used. Namely, it is intended to lower the threshold voltage vt of only the column selecting MOSFETs based on the fabrication process.

The column selecting characteristics which involves the balance of write and read operations is attained by the adjustment in process which is relatively stable (operations vary in the same direction, instead of being opposite) against the fluctuation of power voltage and temperature and less debases the read margin. However, if the non-selecting gate voltage is brought to the low level such as the ground voltage, there emerges a leak current from the global bit line gb to unselected bit lines bl. Assuming that there are 1000 pairs of unselected bit lines bl and selected bit lines bl have a current flow of 1 mA/$\mu$m, even a small leak current of 1 $\mu$A/$\mu$m will amount to about 1 mA/$\mu$m flowing through the 1000 unselected bit lines, which jeopardizes the read operation due to that high noise level comparable to the signal level and necessitates a doubled supply current for the write amplifier.

Figure 11:
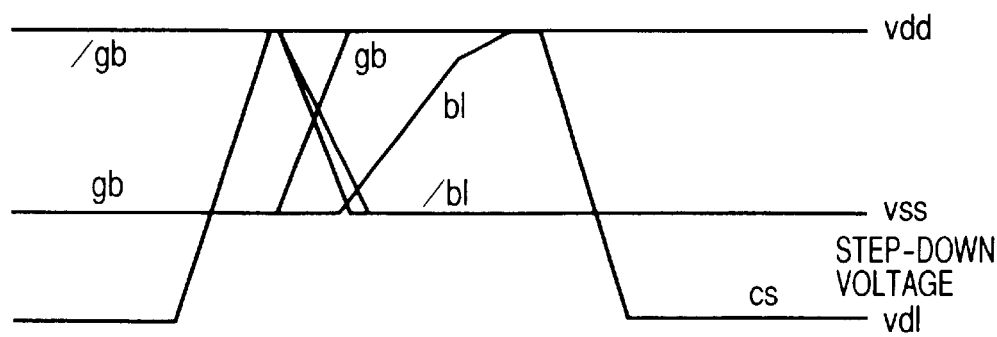
FIG. 11 is a waveform diagram used to explain an example of the write operation of the inventive DRAM.

On this account, this embodiment is designed to set the non-selecting level of the column select signal cs to the negative step-down voltage vdl as shown by the waveform diagram of FIG. 11. Based on this setting of the selecting level and non-selecting level to be the power voltage vdd and negative voltage vdl, respectively, it is intended to reduce the loss of the write level in the selected state and the leak current in the unselected state. The active select signal has the voltage level of the power voltage vdd, and therefore it does not deteriorate the read margin. The step-down non-selecting voltage is solely intended to reduce the leak current of the switching MOSFETs Q8 and Q9, and it has logically no lower limit in the same situation as the step-up select voltage level of the word line, and accordingly does not need precise voltage control.

Figure 22:
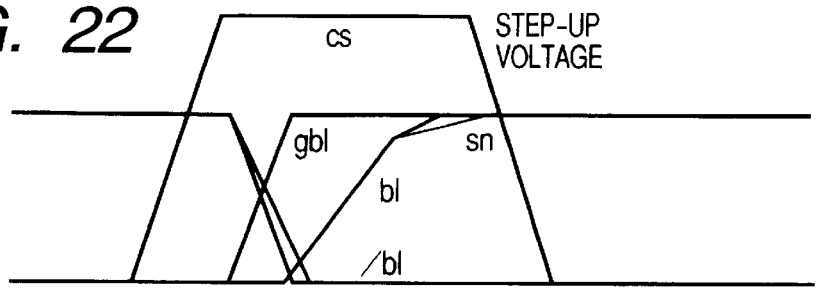
FIG. 22 is a waveform diagram used to explain another example of the write operation of the inventive DRAM.

An alternative scheme of lowering in effect the threshold voltage vt of the column select switching MOSFETs is to raise the voltage level of the column select signal cs higher than the power voltage vdd as shown in FIG. 22. This scheme is identical to the case of raising the voltage level of word line (local word line) higher than the threshold voltage of the address selecting MOSFETs Qm for the full read/write from the memory cell. For the word line selection, the step-up voltage vdh of word line has only lower limit vdd+vt and has no upper limit.

Accordingly, it seems convenient for the column select operation to use the step-up voltage vdh of word line for the column select signal cs, however, the voltage level of the column select signal cs directly affects the read margin. Specifically, a higher voltage level of the signal cs increases the drive power of the MOSFETs Q8 and Q9, resulting in a degraded read margin. Conversely, a lower voltage level of the signal cs creates a level loss of the threshold voltage vt of the MOSFETs Q8 and Q9, resulting in a longer write time. The voltage control range is very narrow, and this scheme involves a risk of degraded margins of both the write and read operations. Therefore, using a step-up voltage for the column select signal cs necessitates an additional stabilized voltage generation circuit, resulting in an enlarged circuit scale.

Figure 12:
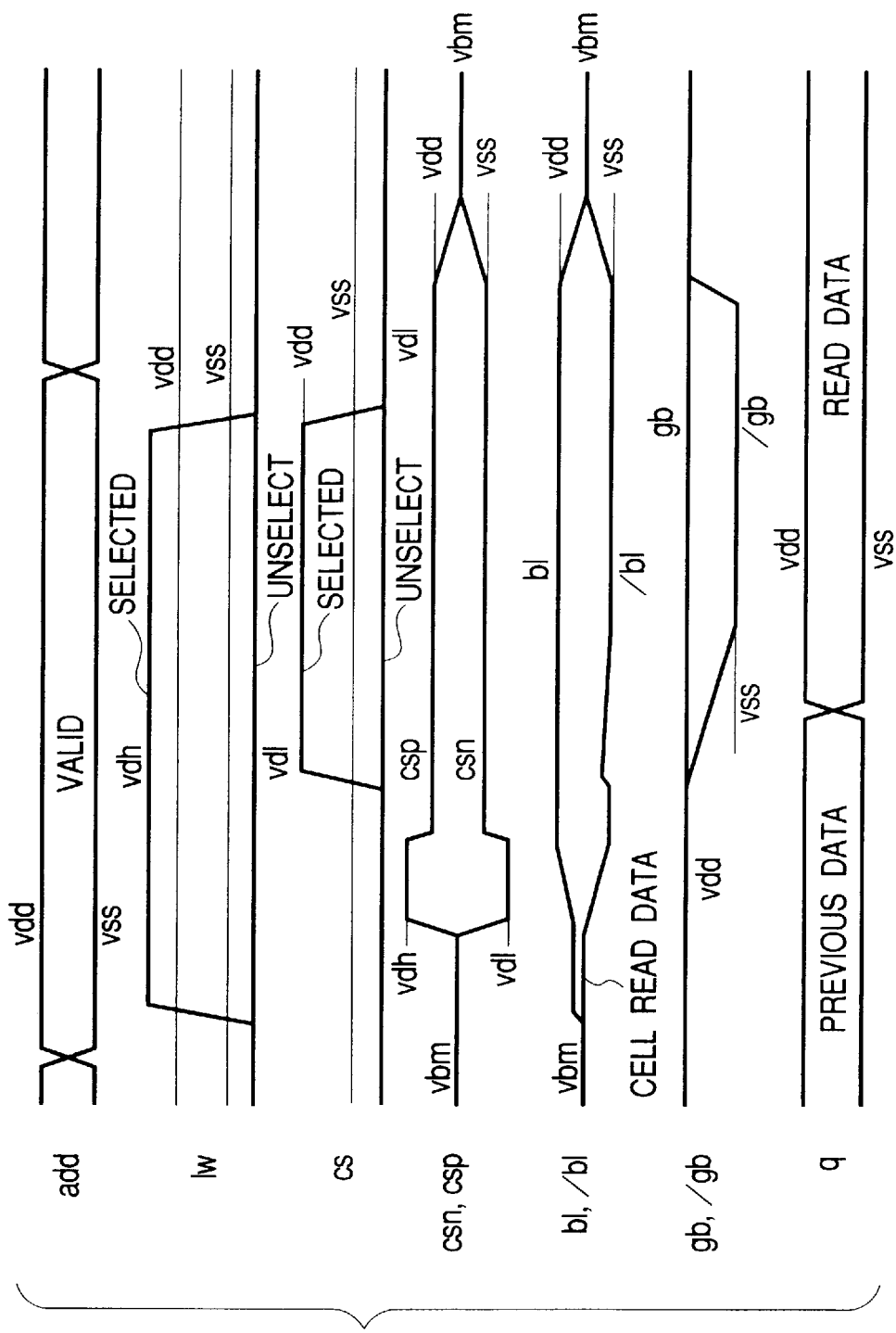
FIG. 12 is a waveform diagram used to explain an example of the read operation of the inventive DRAM.

FIG. 12 shows an example of the waveforms of the read operation of the DRAM. The input address signal (add) is decoded to select local word lines (will be termed simply "word lines") wl. The word lines wl have their non-selecting level set to be the negative voltage vdl in this embodiment, although this affair is not compulsory. Inconsequence, the address selecting MOSFETs of memory cells have their leak current suppressed by the presence of the negative voltage (back bias) applied to the substrate and the above-mentioned negative voltage of word line, thereby extending the data holding time.

At another viewpoint, it is possible for the memory cell to have the same MOSFET structure as other peripheral circuits, instead of having a thicker gate insulating film for the reduction of leak current, and this scheme simplifies the fabrication process. Particularly, for such a system LSI as described previously, it is advantageous in that DRAMs can be formed based on the standard CMOS process designed for processors, etc.

By the word line selecting operation, a small voltage difference derived from stored charges of a memory cell arises between the bit lines bl and /bl, and this voltage difference is expanded by overdriving at the sense amplifier drive voltages csn and csp. After the bit lines bl and /bl have their voltages growing to the power voltage vdd and ground voltage vss, the drive voltages csn and csp are taken over by the supply voltages vdd and vss.

When the column select signal cs is switched from such a non-selecting level as the negative voltage vdl to such a selecting level as the power voltage vdd by the column selecting operation, the switching MOSFET turns on to connect the selected bit lines bl and /bl to the global bit lines gb and /gb. The column selecting operation raises the low-level bit line /bl momentarily due to the global bit lines gb and /gb which have been precharged to the power voltage vdd, and it is pulled back to such a low level as the ground voltage vss by the operation of sense amplifier. The signal voltages on the global bit lines gb and /gb are amplified by the main amplifier, and released as readout signal (q) through the latch circuit.

Figure 13:
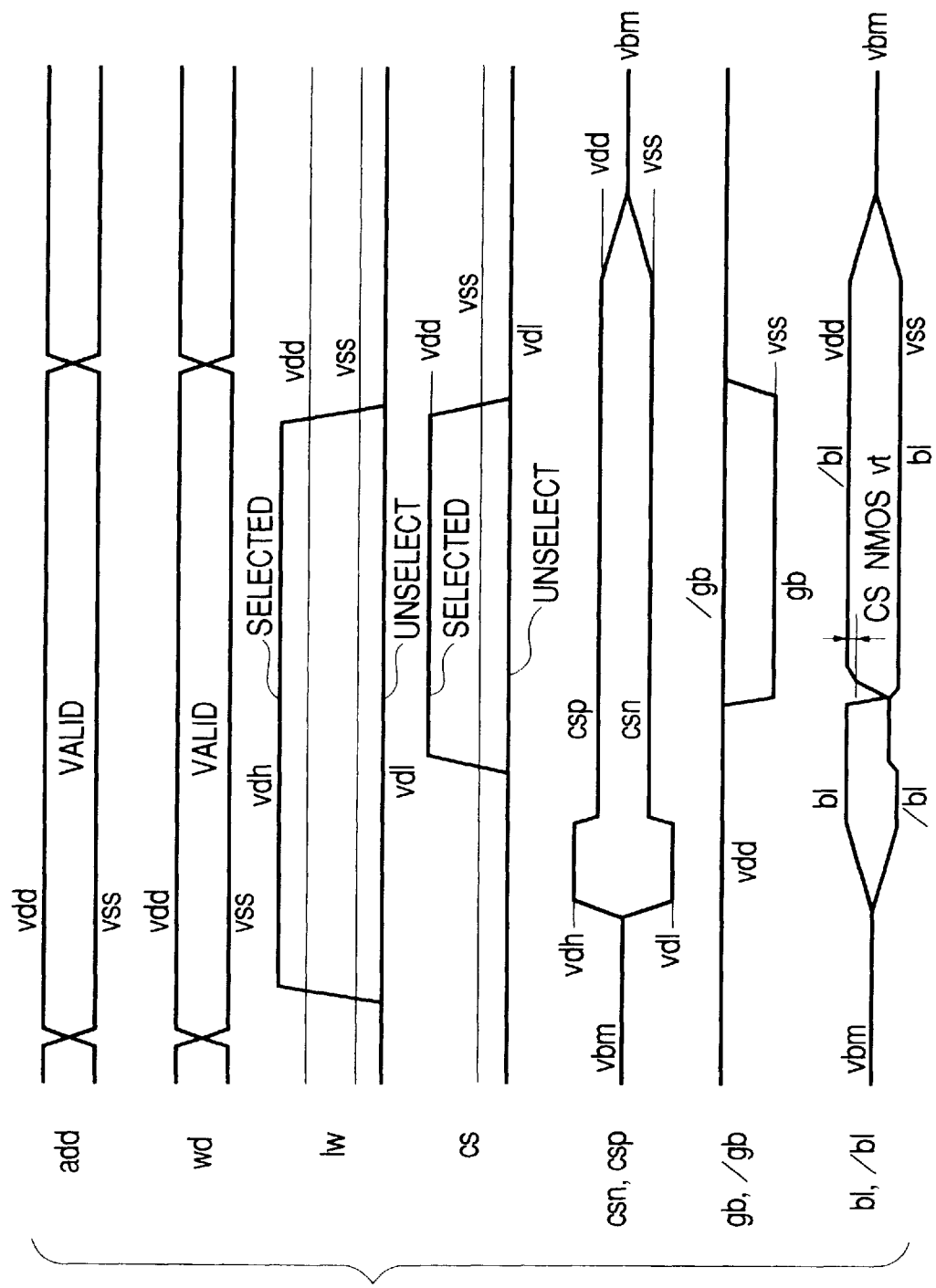
FIG. 13 is a waveform diagram showing an example of the write operation of the inventive DRAM.

FIG. 13 shows an example of the waveforms of the write operation of the DRAM. The input address signal add is decoded to select word lines wl. A small voltage difference derived from stored charges of a memory cell arises between the bit lines bl and /bl, and it is amplified by the sense amplifier based on the drive voltages csn and csp. These operations are identical to the read operation explained above. The memory cell capacitor substantially losses the stored charges by the word line selecting operation as mentioned previously, and therefore the voltages on the bit lines bl and /bl resulting from the amplification of the sense amplifier are written back to the memory cell capacitor.

When the column select signal cs is switched from such an non-selecting level as the negative voltage vdl to such a selecting level as the power voltage vdd by the column selecting operation, the switching MOSFET turns on to connect the selected bit lines bl and /bl to the global bit lines gb and /gb. After the write amplifier places the signal to be written on the global bit lines gb and /gb, the sense amplifier has its latch state reversed as described above, causing the bit lines bl and /bl to have their voltages reversed and written to the memory cell.

Figure 14:
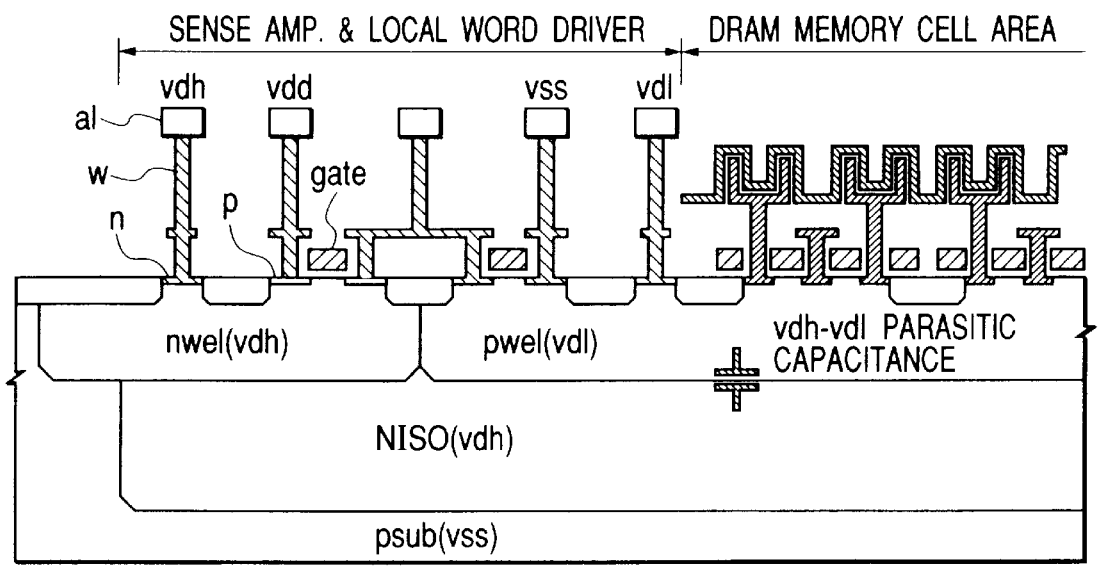
FIG. 14 is a schematic cross-sectional diagram showing an embodiment of the structure of the semiconductor integrated circuit device based on this invention.

FIG. 14 shows schematically the cross-sectional structure of the semiconductor integrated circuit device based on an embodiment of this invention. The figure does not show insulating films between layers. The source/drain diffusion layers of MOSFETs are shown by blank areas for the p-type and filled areas for the n-type. Shown in the figure are the memory cell area and the section of sense amplifier and local word line driver of the DRAM out of the semiconductor device which forms the system LSI.

On the surface of a p-type semiconductor substrate (psub) having the application of the ground voltage vss, an n-type well region is formed to cover the memory cell area and the section of sense amplifier and local word line driver of the DRAM. This region provides an n-type separation region (niso). The n-type separation region niso has the formation of a p-type well region (pwel), in which the address selecting MOSFET of memory cell and n-channel MOSFETs of sense amplifier, etc. are formed. The p-channel MOSFETs are formed in the n-type well region (nwel) The n-type well region nwel and separation region niso are connected electrically based on the formation of junction, although this affair is not compulsory, and the step-up voltage vdh is applied as bias voltage to these regions nwel and niso through an n-type semiconductor region for ohmic contact which is formed in the n-type well region. The p-type well region pwel has the application of the negative voltage vdl as bias voltage through a p-type semiconductor region for ohmic contact. The bias voltage vbl is supplied to the p-type well region pwel which covers the memory cell array, and the step-up voltage vdh is applied to the separation region niso which covers the n-type well region nwel. Accordingly, the parasitic capacitance emerging between the regions pwel and niso is effective for the stabilizing capacitance of the power voltages vdh and vdl, and it is particularly the case where these voltages are produced by the voltage convert circuit IMVC as shown in FIG. 1.

Figure 15:
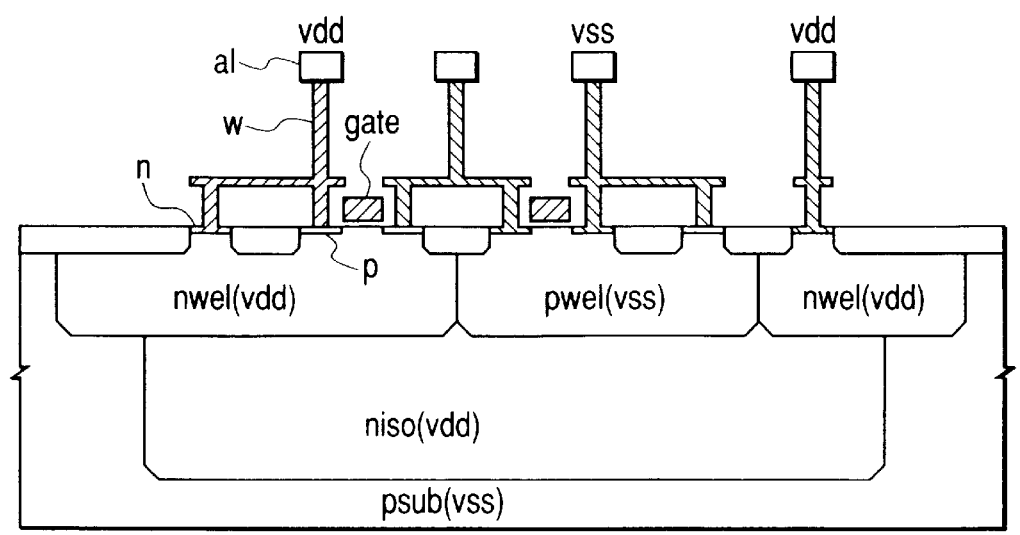
FIG. 15 is a schematic cross-sectional diagram showing an embodiment of the structure of the semiconductor integrated circuit device based on this invention.

FIG. 15 shows schematically the cross-sectional structure of the semiconductor device based on an embodiment of this invention. The figure does not show insulating films between layers. The source/drain diffusion layers of MOSFETs are shown by blank areas for the p-type and filled areas for the n-type. Shown in the figure is the address selecting circuit or other logic circuit out of the semiconductor device which forms the system LSI.

In the n-type separation region niso described above, a p-type well region pwel is formed, in which the n-channel MOSFETs described above are formed. P-channel MOSFETs are formed in the n-type well region nwel. The n-type well region nwel and separation region niso are connected electrically based on the formation of junction, and the power voltage vdd is applied as bias voltage to these regions nwel and niso through an n-type semiconductor region for ohmic contact which is formed in the n-type well region. The p-type well region pwel has the application of the ground voltage vss as bias voltage through a p-type semiconductor region for ohmic contact.

Figure 16A:
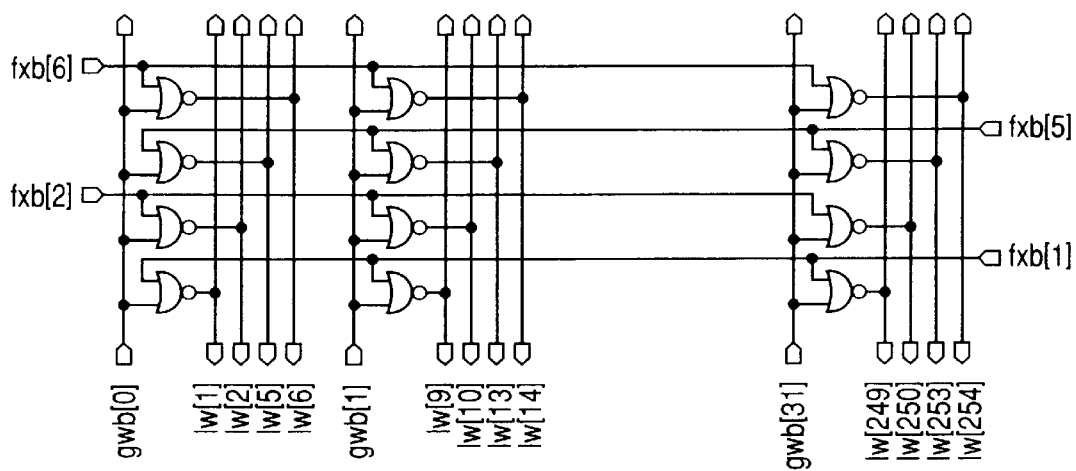
FIG. 16A and FIG. 16B are circuit diagrams showing an embodiment of the local word driver (lwd) shown in FIG. 2, FIG. 4, etc.
Figure 16B:
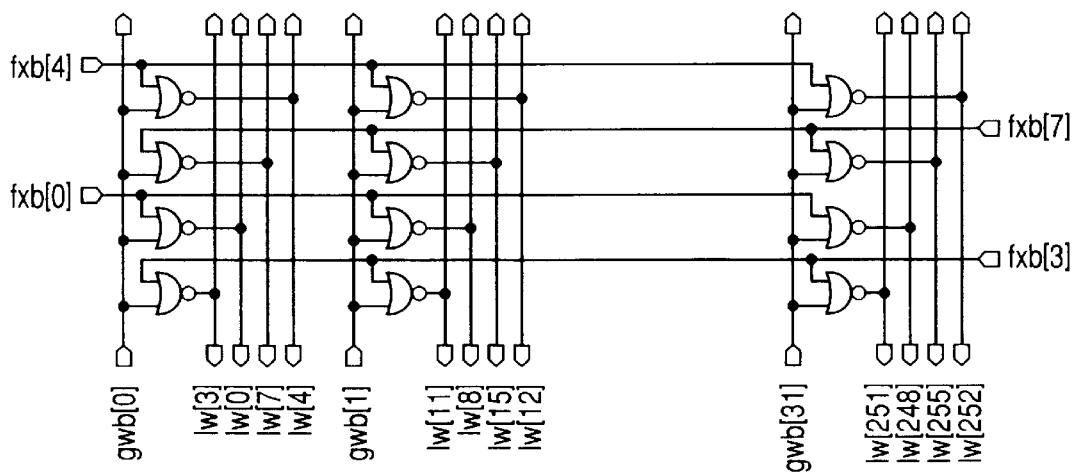
Figure 16B:
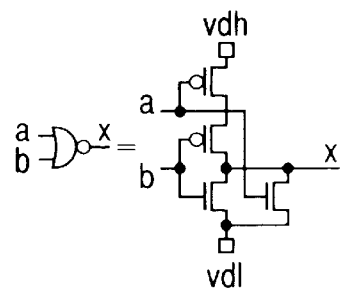

FIGS. 16A and 16B are circuit diagrams of an embodiment of the local word driver lwd shown in FIG. 2, FIG. 4 and other figures. A main word line (gwb) and a sub word line (fx) coming from a drive circuit (drive) drive a specific local word line (lw). Drivers are of the NOR-gate type, and 128 drivers which drive only even-numbered or odd-numbered local word lines are aligned as shown in the figures. The even-numbered and odd-numbered drivers are disposed alternately to have a complementary arrangement over the memory cell array. The NOR-gate drive circuit operates by being supplied with the step-up voltage vdh and negative voltage vdl, as shown, and given drive signals which have a low level of the negative voltage vdl lower than the ground voltage vss and a high level of the step-up voltage vdh higher than the power voltage vdd on both the local word line lw and main word line gwb.

Figure 17:
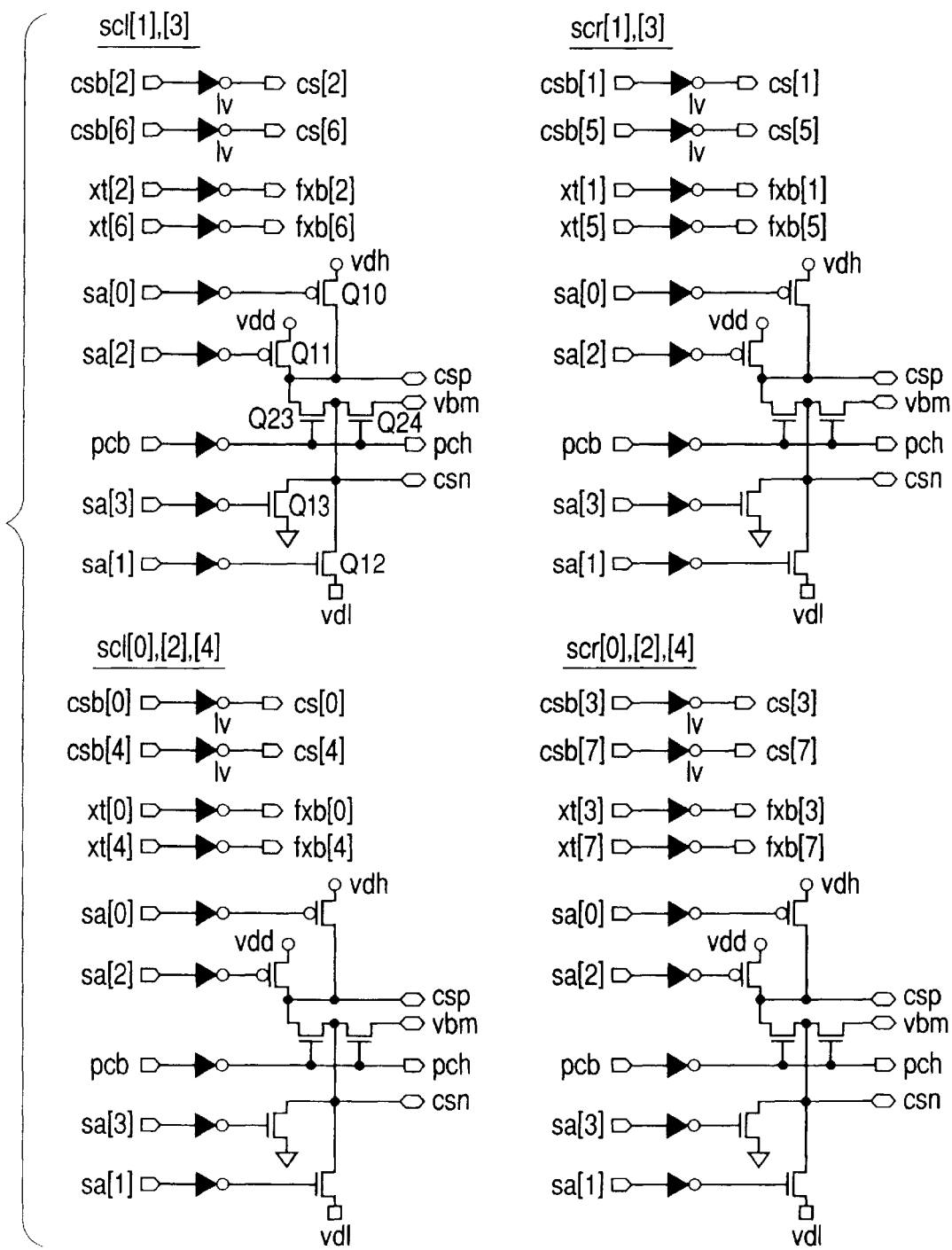
FIG. 17 is a circuit diagram showing an embodiment of the local word driver (lwd) and sense amplifier (sa)

FIG. 17 is a circuit diagram of an embodiment of the local word driver lwd and the drive circuits of sense amplifier sa. The circuits are shown in groups of scl(1)–scl(4) and scr (1)-scr(4) in the four areas described previously. MOSFETs for supplying the drive voltages to the common source lines csp and csn of the sense amplifiers are disposed distributively in this section. Among the circuit groups of the same arrangement, scl(1) and scl(3) will be explained in the following.

Initially, the p-channel MOSFET Q10 and n-channel MOSFET Q12 which receive the signals sa(0) and sa(1) on their gates supply the step-up voltage vdh and step-down voltage vdl to the common source lines csp and csn, respectively, thereby accelerating the amplifying operation of the sense amplifier sa. After the bit lines bl and blb are driven to come close to the power voltages vdd and vss, the signals sa(0) and sa(1) are switched to sa(2) and sa(3), causing the MOSFETs Q10 and Q12 to turn off and MOSFETs Q11 and Q13 to turn on, and the common source line csn has the ground voltage vss to bring the sense amplifier to the hold state. The signals sa(0) through sa(3) have an amplitude of vdh–vdl.

The sub word line select signal (fx) which drives the local word driver lwd has an amplitude of vdh–vdl, whereas the column switch control signal cs which is fed through an inverter iv has a high level of the power voltage vdd, instead of the step-up voltage vdh, and a low level of the negative voltage vdl.

Figure 18:
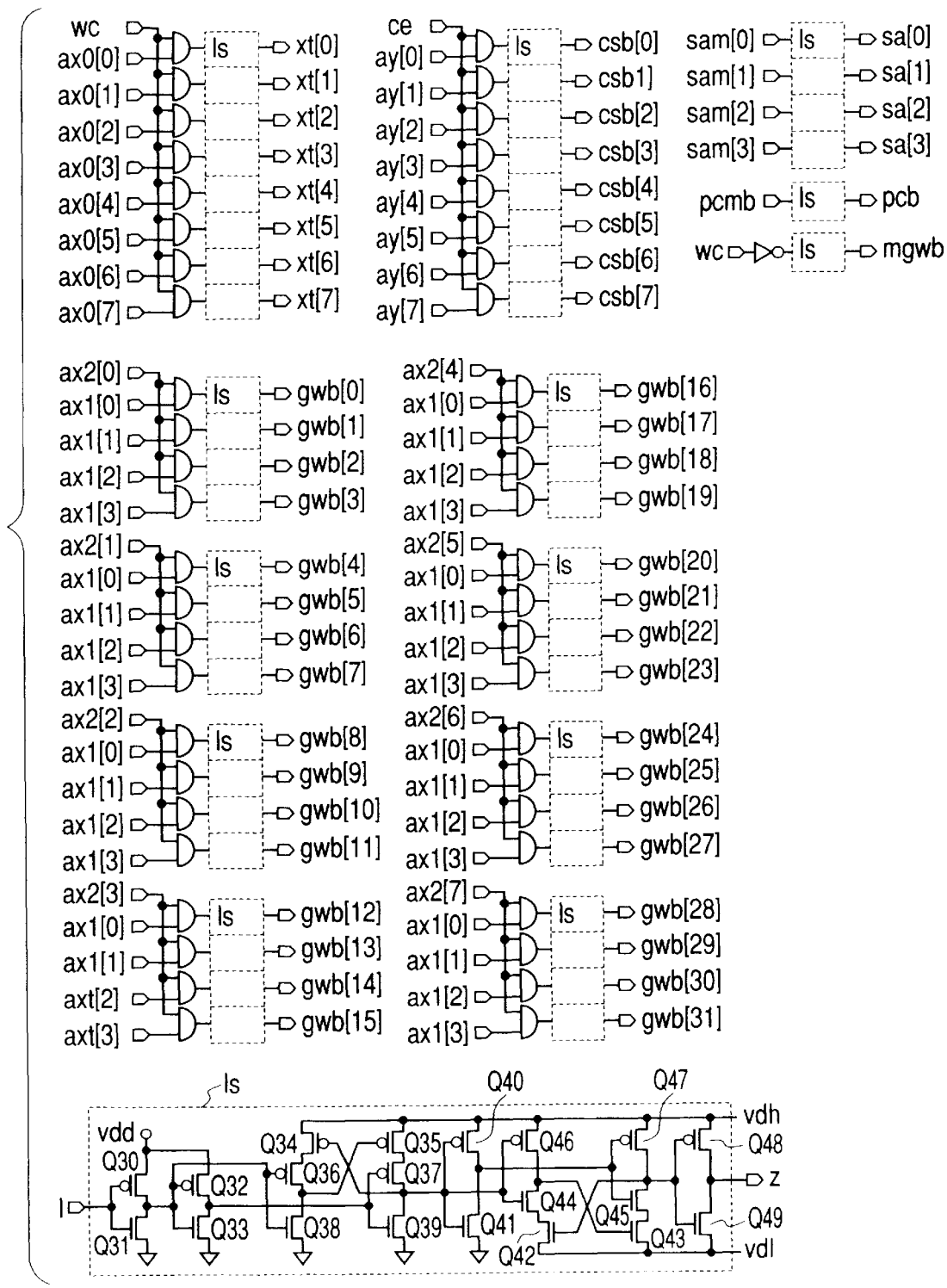
FIG. 18 is a circuit diagram showing en embodiment of the level shift circuit (is) used in the inventive DRAM.

FIG. 18 is a circuit diagram of an embodiment of the level convert circuit (is) used in the DRAM. All input signals to the DRAM have a high level of the power voltage vdd and a low level of the ground voltage vss, and the signals have their amplitude converted to be vdh–vdl by this circuit section. Each converting circuit unit has two stages, of which the first stage of MOSFETs Q30–Q39 converts the high-level voltage vdd into the step-up voltage vdh and the second stage of MOSFETs Q40–Q49 converts the low-level ground voltage vss into the negative voltage vdl.

Figure 19:
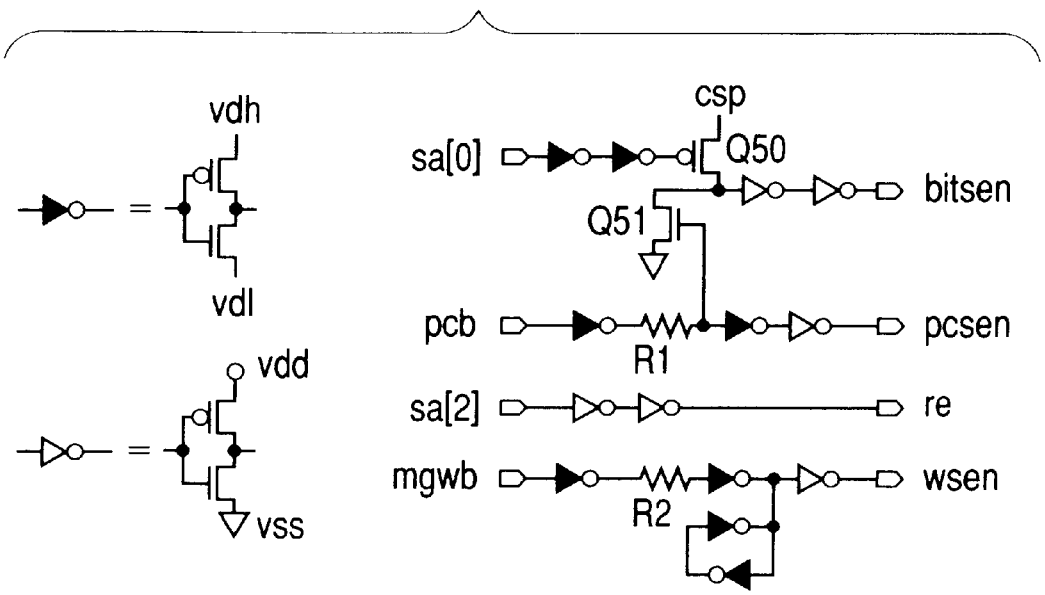
FIG. 19 is a circuit diagram showing an embodiment of the monitor circuit (mon) shown in FIG. 3.
Figure 20:
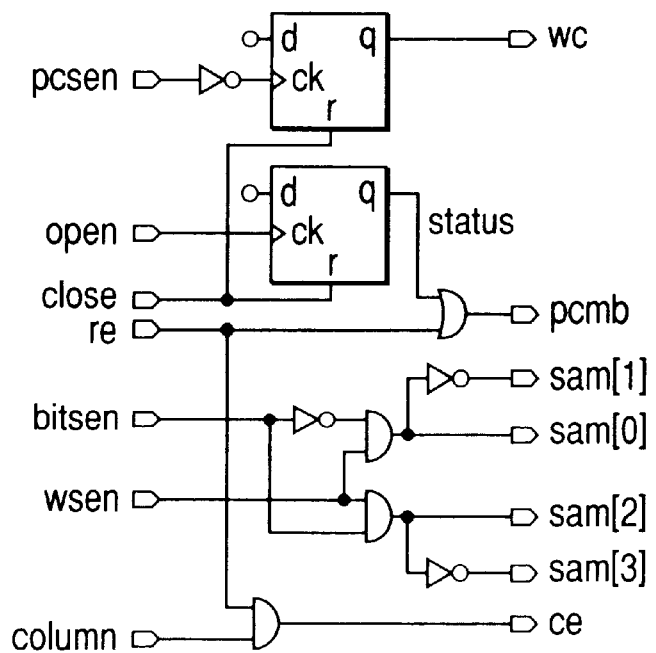
FIG. 20 is a circuit diagram showing an embodiment of the control circuit (sq) shown in FIG. 3.

FIG. 19 is a circuit diagram of an embodiment of the monitor circuit mon shown in FIG. 3. MOSFETs Q50 and Q51 divide the voltage of the common source line csp of the sense amplifier, and the following inverter produces a logic signal (bitsen) when the divided voltage reaches vdd. The circuit mon and another circuit shown in FIG. 20 will be explained with reference to the waveform diagram of FIG. 21.

Figure 21:
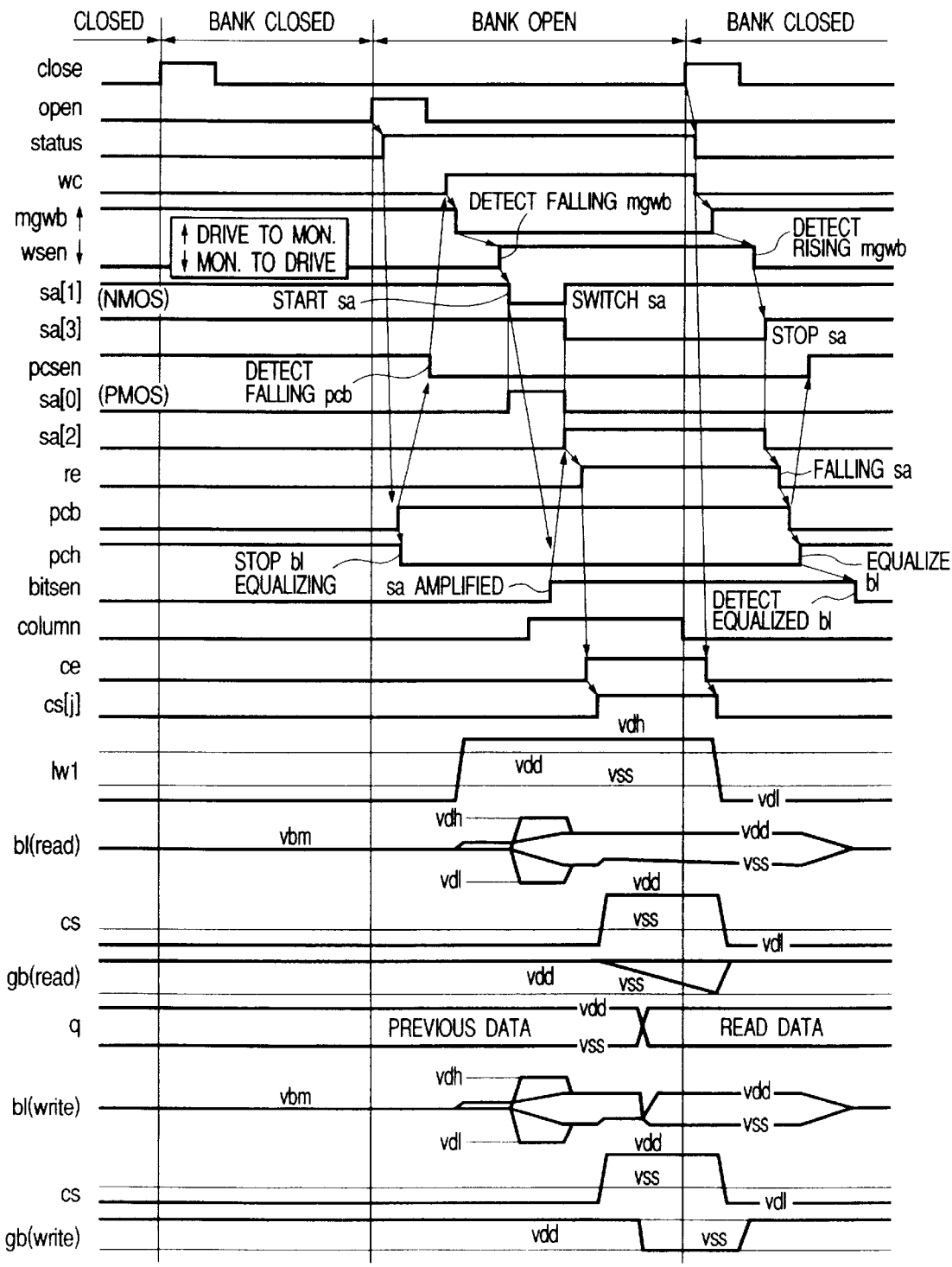
FIG. 21 is a waveform diagram used to explain the overall operation of the inventive DRAM.

FIG. 21 shows the waveforms used to explain the operation of the whole DRAM. The DRAM has its operational sequence implemented by the transaction of signals between the circuits (sq and mon) shown in FIG. 19 and FIG. 20 located in the upper and lower sections of the memory mat (mat).

A signal (close) brings the DRAM to the precharged state. This signal has no effect if the memory mat is already in the precharged state. A signal (open) is the starting signal which activates the memory mat. When this signal enters the memory mat in the precharged state, a signal (status) first becomes logical "1" (high level). Subsequently, the precharge signal pcb goes high (inactive) to stop the precharge (equalizing) operation of the bit lines bl.

The circuit mon detects the high-level precharge signal pcb at the far-end (upper) point of the signal line, and sets the signal (wc) to logical "1" (high level) thereby to activate the word line. The activated wc signal causes the monitor word line (mgwb) to be brought to logical "0" (low level or active), and it is sent to the mon circuit at the top. On detecting the activation of mgwb, the mon circuit sends a signal (wsen) back to the sq circuit at the bottom.

The sq circuit which has received the wsen signal recognizes the presence of a signal on the bit line bl, and produces a sense amplifier start-up signal. The signals sa(0) and sa(1) are activated to supply the step-up and step-down voltages vdh and vdl to the sense amplifier. Subsequently, the mon circuit is indicated by a circuit that the bit line bl is driven nearly to the power voltage vdd or ground voltage vss, and it produces a signal (bitsen) to switch the sense amplifier drive signal to have the vdd–vss amplitude. This signal becomes the end signal (re) of the operation of the row of memory mat.

When the close signal enters the memory mat (mat) in the active state, the status signal first turns to "0", and next the ce signal goes "0" (inactive) to stop the column operation. After the deactivation of the main word line has been confirmed by the operation of the monitor word line, the wcsen signal is lowered, and next the sense amplifier is deactivated. Following the confirmation of deactivation of sense amplifier, precharging of the bit line bl is initiated.

Signal (column) is a connection request signal derived from the signal cs for the connection between the bit lines bl and the global bit line gb for the read/write operation. This signal is effective only when the re (row activation end signal) and status signal are active. When this signal becomes active, the ce signal is released so that the column select signal cs selected by the address ay is activated.

For the read operation, the global bit lines gb which have been precharged to the power voltage vdd are pulled down by the sense amplifiers to take out the signal levels. For the write operation, the column select signal cs is activated and, at the same time, the global bit lines gbl are driven to the power voltage vdd or ground voltage vss.

This embodiment is designed to time the end of precharging, selection of word lines and overdriving of sense amplifiers, while monitoring the circuit operations, and accordingly it becomes unnecessary to have a worst-case timing margin which covers the disparity of element characteristics, whereby it can stabilize and speed up the circuit operation.

Figure 23A:
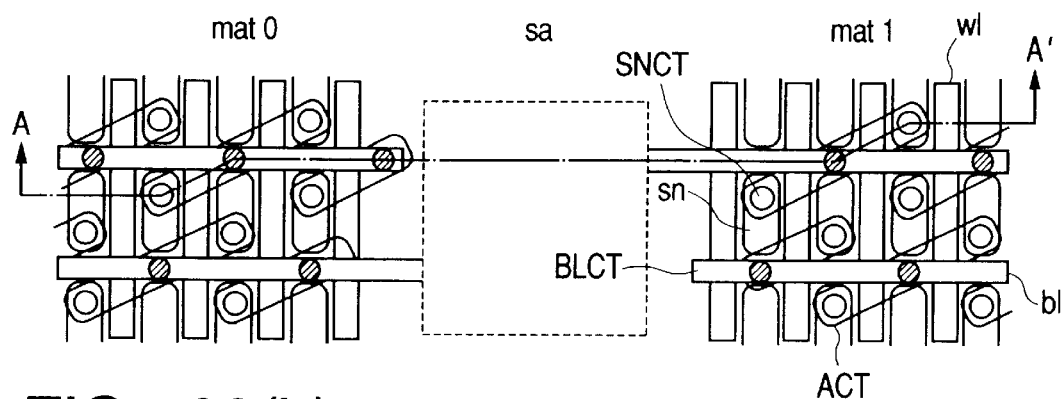
FIGS. 23A and 23B are diagrams explaining another embodiment of the memory cell array of the inventive DRAM.
Figure 23B:
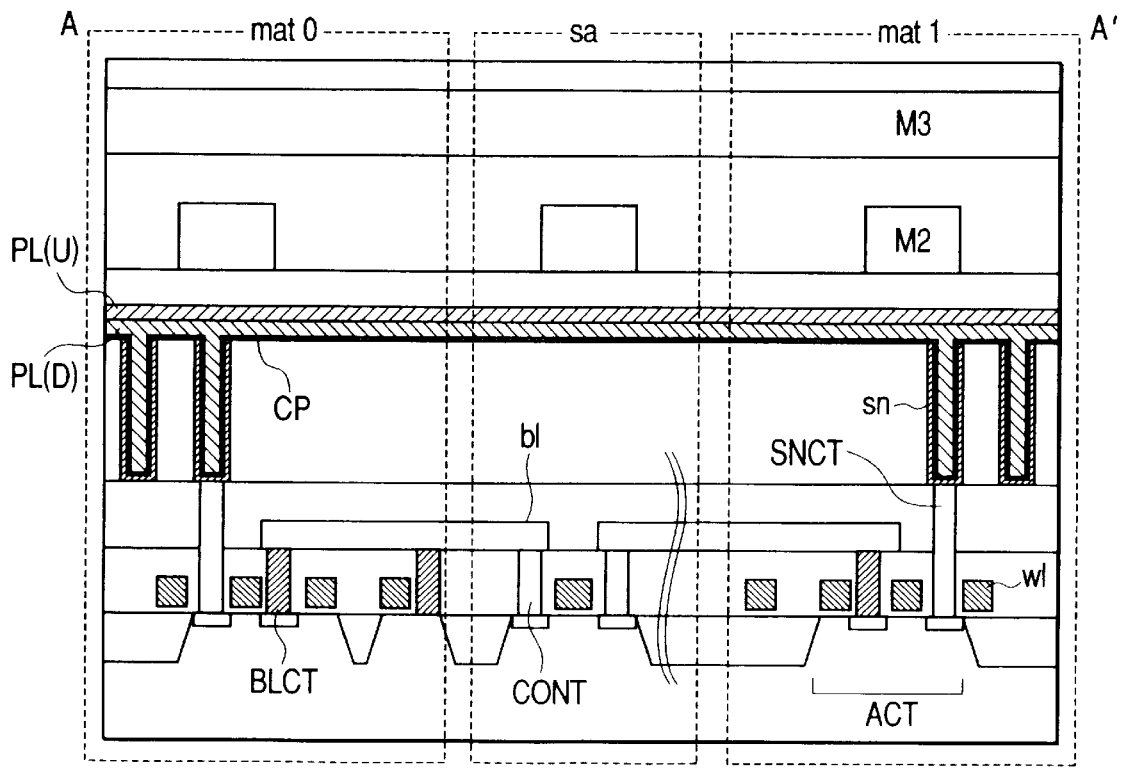

FIGS. 23A and 23B shows another embodiment of the memory cell array of the DRAM. This embodiment is based on so-called one-intersection scheme in which bit lines bl and /bl align on both sides of a sense amplifier sa. Memory cells are located on the intersections of word lines and bit lines, and accordingly memory cells can be integrated higher by about 1.5 times than the turn-over bit line scheme described previously. FIG. 23A shows the layout of memory mats mat0 and mat1 which are formed on both sides of the sense amplifier sa, and FIG. 23B shows the cross-sectional structure taken along the line A-A' of FIG. 23A. The layout and cross section of the sense amplifier sa which is formed between the memory mats mat0 and mat1 are not show in these figures.

Indicated by ACT is an active region of MOSFETs, SNCT is a contact (connecting section) which connects the source/drain diffusion layer of MOSFETs formed in the active region ACT to the storage node sn of the memory cell, and BLCT is a contact (connecting section) which connects the bit line bl to another MOSFET source/drain diffusion layer corresponding to the input/output terminal of memory cell. Indicated by CP is the insulating film of the storage capacitor. The metallic layer Ml of the first layer and the bit line bl are the same wiring layer, and the polysilicon layer FG of the first layer and the local word line wl are the same wiring layer.

By connecting the memory mats mat0 and mat1 on both sides of the sense amplifier sa with the plate electrode PL, instead of cutting it over the sense amplifier sa, as shown in FIG. 23B, it becomes possible to reduce significantly the resistance between the plate electrode PL of memory mat mat0 and the plate electrode PL of memory mat mat1.

The memory cells are based on the COB (capacitor over bit line) structure. Specifically, the storage node sn is formed above the bit line bl. Consequently the plate electrode PL can be formed as a sheet instead of being divided by the bit line bl and contact BLCT of the address selecting MOSFET in the memory mat, whereby the resistance of plate electrode PL can be reduced.

In this embodiment, the plate electrode PL has a laminated structure of PL(D) and PL(U) as shown in FIG. 23B, and it is advantageous for the reduction of sheet resistance of the plate electrode PL. For example, in the case of using a high dielectric film such as BST or Ta!2O!5 for the storage capacitor insulating film CP and using Ru for the lower electrode (storage node) sn and upper electrode lower layer PL(D), the capacitance of the storage capacitor can be increased. Since Ru has a smaller sheet resistance as compared with Si, it reduces the resistance of the plate electrode PL.

If W is laminated on the plate electrode PL(U), the resistance of the plate electrode PL can further be reduced. Reducing the resistance of plate electrode PL speeds up the cancellation of noises on the plate electrode PL, resulting in a reduced plate electrode noise. The plate electrode PL(D) may be formed of TiN to achieve the same effect as described above.

The effectiveness achieved by the foregoing embodiments is as follows.

(1) A DRAM includes sense amplifiers each formed of a latch circuit consisting of MOSFETs of a first and second conductivity types with the application of a first and second voltages to the sources thereof, respectively, and having a pair of input/output nodes corresponding to a first bit line pair which is connected with a plurality of dynamic memory cells, and further includes pairs of switching MOSFETs of the first conductivity type which connect selectively an input/output node pair of the latch circuits to a pair of second bit lines provided commonly to a plurality of the first bit line pair in response to the reception of the select signal, and the switching MOSFETs are designed to have their threshold voltage set smaller in terms of absolute value than the threshold voltage of the MOSFETs of the first conductivity type of the latch circuits and the select signal is designed to have its level of turning off the switching MOSFETs set greater in terms of absolute value than the first voltage with respect to the second voltage, whereby the retention of operational margin and the speed-up of the DRAM at a low operation voltage can be accomplished.

(2) In addition to the foregoing, the CMOS latch circuit is adapted to receive a voltage difference between a voltage read out of a memory cell onto one bit line of the bit line pair and a precharge voltage on another bit line and amplify the voltage difference to have a first and second voltages derived from power voltages in response to the word line selecting operation, and provided in operation with an overdrive period at the commencement of amplifying operation until the bit lines reach the first or second voltage, in which period the latch circuit is supplied with an operation voltage which is greater in terms of absolute value than the first or second voltage, whereby the further speed-up of the DRAM can be accomplished.

(3) A DRAM includes a plurality of dynamic memory cells disposed at the intersections of a plurality of first bit line pairs and a plurality of word lines, amplifying circuits each formed of latch circuits consisting of MOSFETs of a first and second conductivity types and having a pair of input/output nodes corresponding to a first bit line pair, and further includes pairs of switching MOSFETs of the first conductivity type which connect an input/output node pair of the latch circuits to a second bit line pair provided commonly to the first bit line pairs in response to the reception of the select signal, and the switching MOSFETs are designed to have their threshold voltage set smaller in terms of absolute value than the threshold voltage of the MOSFETs of the first conductivity type of the latch circuits and the select signal is designed to have its level of turning off the switching MOSFETs set smaller in terms of absolute value than the source voltage of the switching MOSFETs, whereby the retention of operational margin and the speed-up of the DRAM at a low operation voltage can be accomplished.

(4) In addition to the foregoing, the latch circuit is adapted to receive a voltage difference between a voltage read out of a memory cell onto one bit line of the bit line pair and a precharge voltage on another bit line and amplify the voltage difference to have a first and second voltages derived from power voltages in response to the word line selecting operation, and provided in operation with an overdrive period at the commencement of amplifying operation until the bit lines reach the first or second voltage, in which period the latch circuit is supplied with an operation voltage which is greater in terms of absolute value than the first or second voltage, whereby the further speedup of the DRAM can be accomplished.

(5) A DRAM includes a plurality of dynamic memory cells disposed at the intersections of a plurality of first bit line pairs and a plurality of word lines to form a memory cell array, sense amplifiers each formed of a latch circuit consisting of MOSFETs of a first and second conductivity types with the application of a first and second voltages to the sources thereof, respectively, and having a pair of input/output nodes corresponding to a first bit line pair, and further includes pairs of switching MOSFETs of the first conductivity type which connect an input/output node pair of the latch circuits to a second bit line pair provided commonly to the first bit line pairs in response to the reception of the select signal, and the switching MOSFETs and the MOSFETs of the first conductivity type are designed to have a same structure and the select signal is designed to have its level of turning on the switching MOSFETs set greater in terms of absolute value than the second voltage with respect to the first voltage, whereby the retention of operational margin and the speed-up of the DRAM at a low operation voltage can be accomplished.

(6) In addition to the foregoing, the latch circuit is adapted to receive a voltage difference between a voltage read out of a memory cell onto one bit line of the bit line pair and a precharge voltage on another bit line and amplify the voltage difference to have a first and second voltages derived from power voltages in response to the word line selecting operation, and provided in operation with an overdrive period at the commencement of amplifying operation until the bit lines reach the first or second voltage, in which period the latch circuit is supplied with an operation voltage which is greater in terms of absolute value than the first or second voltage, whereby the further speedup of the DRAM can be accomplished.

(7) A DRAM includes a plurality of dynamic memory cells disposed at the intersections of a plurality of first bit line pairs and a plurality of word lines to form a memory cell array, sense amplifiers each formed of a latch circuit consisting of MOSFETs of a first and second conductivity types with the application of a first and second voltages to the sources thereof, respectively, and having a pair of input/output nodes corresponding to a first bit line pair, and further includes pairs of switching MOSFETs of the first conductivity type which connect an input/output node pair of the latch circuits to a second bit line pair provided commonly to the first bit line pairs in response to the reception of the select signal, and the switching MOSFETs are designed to have their threshold voltage set smaller in terms of absolute value than the threshold voltage of the MOSFETs of the first conductivity type of the latch circuits and the select signal is designed to have its level of turning off the switching MOSFETs set smaller in terms of absolute value than the source voltage of the switching MOSFETs, whereby the retention of operational margin and the speed-up of the DRAM at a low operation voltage can be accomplished.

(8) In addition to the foregoing, the latch circuit is adapted to receive a voltage difference between a voltage read out of a memory cell onto one bit line of the bit line pair and a precharge voltage on another bit line and amplify the voltage difference to have a first and second voltages derived from power voltages in response to the word line selecting operation, and provided in operation with an overdrive period at the commencement of amplifying operation until the bit lines reach the first or second voltage, in which period the latch circuit is supplied with an operation voltage which is greater in terms of absolute value than the first or second voltage, whereby the further speedup of the DRAM can be accomplished.

(9) In addition to the foregoing, the first conductivity type is the n-channel type, the second conductivity type is the p-channel type, the first voltage is the power voltage, the second voltage is the ground voltage, and the select signal is designed to have its level of turning off the switching MOSFETs set negative below the ground voltage, whereby the higher integration and the speed-up of the DRAM can be accomplished.

(10) In addition to the foregoing, the memory cells are each made up of a selecting MOSFET and a storage capacitor, the selecting MOSFET is formed in a p-type well region, the p-type well region is formed in an n-type separation region, which is formed deeply in a p-type substrate, and supplied with a negative voltage, the n-type separation region is supplied with a step-up voltage which is higher than the first voltage, with a parasitic capacitance being used as voltage stabilizing capacitance, the negative voltage is used commonly for the selection signal level of turning off the switching MOSFETs, overdriving of sense amplifier and word line non-selecting level, and the step-up voltage is used commonly for the word line selecting level and overdriving of sense amplifier, whereby the circuit arrangement can be simplified.

(11) In addition to the foregoing, the first voltage is set to be such a low voltage that the time needed to reverse the latched state of the sense amplifier, in the case of supplying the first voltage to the gate and drain of the n-channel MOSFETs of the sense amplifier, is longer than the reading amplification time of the sense amplifier, whereby the reduction of power consumption and the speed-up of the DRAM can be accomplished.

(12) In addition to the foregoing, the switching MOSFETs are designed to have a larger on-state conductance as compared with the on-state conductance of the p-channel MOSFETs of the sense amplifiers so that the write operation margin is ensured, and designed to have a smaller on-state conductance as compared with the on-state conductance of the n-channel MOSFETs of the sense amplifiers so that the read operation margin is ensured, whereby the operation of the DRAM can be stabilized.

Although the present invention has been explained specifically for the embodiments, the invention is not confined to these embodiments, but can be altered obviously in various ways without departing from its substance. For example, the column select switching MOSFETs may be formed of n-channel MOSFETs. In this case, if the threshold voltage is set lower than that of the p-channel MOSFET of the sense amplifier, they are supplied with a control signal cs having such a signal amplitude as vss-vdd. Otherwise, if both MOSFETs are designed to have an equal threshold voltage, the control signal cs is designed to have such a signal amplitude as vdl-vdd. Various arrangements can be taken for the individual circuit sections which constitute the DRAM. This invention can be used extensively for general-purpose DRAMs and synchronous DRAMs, besides DRAMs included in a system LSI.

Among the modes of the present invention disclosed in this specification, the effectiveness achieved by the representative one is summarized as follows. A DRAM includes sense amplifiers each formed of a latch circuit consisting of MOSFETs of a first and second conductivity types with the application of a first and second voltages to the sources thereof, respectively, and having a pair of input/output nodes corresponding to a first bit line pair connected with a plurality of dynamic memory cells, and further includes pairs of switching MOSFETs of the first conductivity type which connect selectively an input/output node pair of the latch circuits to a second bit line pair provided commonly to a plurality of the first bit line pair in response to the reception of the select signal, and the switching MOSFETs are designed to have their threshold voltage set smaller in terms of absolute value than the threshold voltage of the MOSFETs of the first conductivity type of the latch circuits and the select signal is designed to have its level of turning off the switching MOSFETs set greater in terms of absolute value than the first voltage with respect to the second voltage, whereby the retention of operational margin and the speed-up of the DRAM at a low operation voltage can be accomplished.

We claim:

1. A semiconductor device having a memory circuit comprising:
   a plurality of first bit line pairs;
   a plurality of word lines;
   a plurality of dynamic memory cells each disposed at the intersection of one bit line of the first bit line pair and the word line;
   amplifying circuits each formed of a CMOS latch circuit having a pair of input/output nodes corresponding to the first bit line pair;
   a second bit line pair provided commonly to the input/output node pairs of the CMOS latch circuits; and
   pairs of MOSFETs which connect the input/output node pair of the CMOS latch circuits to the second bit line pair in response to the reception of a selection signal,
   wherein said selection signal has a signal amplitude greater than a voltage difference of the input/output node pair of the CMOS latch circuit in its latched state.

2. A semiconductor device according to claim 1, wherein said CMOS latch circuit is adapted to receive a voltage difference between a voltage read out of a memory cell onto one bit line of the bit line pair and a precharge voltage on another bit line and amplify the voltage difference to have a first and second voltages derived from power voltages in response to the word line selecting operation, and provided in operation with an overdrive period at the commencement of amplifying operation until the bit lines reach the first or second voltage, in which period the latch circuit is supplied with an operation voltage which is greater in terms of absolute value than the first or second voltage.

* * * * *